United States Patent
Liu et al.

(10) Patent No.: US 8,605,507 B2
(45) Date of Patent: Dec. 10, 2013

(54) FLASH PROGRAMMING TECHNOLOGY FOR IMPROVED MARGIN AND INHIBITING DISTURBANCE

(75) Inventors: Chuyung Liu, Changhua (TW);
Hsing-Wen Chang, Miaoli (TW);
Yaowen Chang, Hsinchu (TW);
Tao-Cheng Lu, Sanmin (TW)

(73) Assignee: Macronix International Co., Ltd., Hsinchu (TW)

( * ) Notice: Subject to any disclaimer, the term of this patent is extended or adjusted under 35 U.S.C. 154(b) by 44 days.

(21) Appl. No.: 13/349,130

(22) Filed: Jan. 12, 2012

(65) Prior Publication Data

US 2013/0182505 A1    Jul. 18, 2013

(51) Int. Cl.
*G11C 11/34* (2006.01)

(52) U.S. Cl.
USPC ............................ 365/185.17; 365/185.24

(58) Field of Classification Search
USPC .................................. 365/185.17, 185.24
See application file for complete search history.

(56) References Cited

U.S. PATENT DOCUMENTS

| | | | |
|---|---|---|---|
| 5,812,457 | A | 9/1998 | Arase |
| 6,487,117 | B1 | 11/2002 | Choi et al. |
| 6,643,188 | B2 | 11/2003 | Tanaka et al. |
| 7,315,474 | B2 | 1/2008 | Lue |
| 7,599,219 | B2 | 10/2009 | Kim et al. |
| 2009/0010064 | A1* | 1/2009 | Nazarian .................. 365/185.17 |
| 2010/0124123 | A1 | 5/2010 | Lee |
| 2011/0110154 | A1 | 5/2011 | Kim et al. |
| 2012/0182809 | A1* | 7/2012 | Dutta et al. .............. 365/185.18 |

FOREIGN PATENT DOCUMENTS

EP    2048709 A2    4/2009

OTHER PUBLICATIONS

Cho et al., "A Dual-Mode NAND Flash Memory: 1-Gb Multilevel and High-Performance 512-Mb Single Level Modes," IEEE Journal of Solid State Circuits, vol. 36, No. 11, Nov. 2011, 7 pages.
Lee, et al., "A New Programming Disturbance Phenomenon in NAND Flash Memory by Source/Drain Hot-Electrons Generated by GIDL Current," 21st IEEE NVSMW 2006, Feb. 12-16, 2006, pp. 31-33.
Lue et al., "Study of Incremental Step Pulse Programming (ISPP) and STI Edge Effect of BE-SONOS NAND Flash," IEEE 46th Annual International Reliability Physics Symposium, Apr. 27-May 1, 2008, pp. 693-694.

(Continued)

*Primary Examiner* — Michael Tran
(74) *Attorney, Agent, or Firm* — Haynes Beffel & Wolfeld LLP

(57) ABSTRACT

A charge storage memory is configured in a NAND array, and includes NAND strings coupled to bit lines via string select switches and includes word lines. A controller is configured to produce a program bias pulse by biasing the bit lines and string select lines in a first condition; setting a word line coupled to a target cell to a first voltage level while the bit lines and string select lines are in the first condition; thereafter, biasing the bit lines and string select lines in a second condition; and setting the word line coupled to the target cell to a second voltage level higher than the first voltage level while the bit lines and string select lines are in the second condition. Program bias pulses produced in this manner can be used in a modulated incremental stepped pulse programming sequence.

21 Claims, 14 Drawing Sheets

(56) References Cited

OTHER PUBLICATIONS

Park et al., "A 7MB/s 64Gb 3-bit/cell DDR NAND flash memory in 20nm-node technology", Solid-State Circuits Conference Digest of Technical Papers (ISSCC), 2011 IEEE International, Feb. 20-24, 2011, pp. 212-213.

Suh et al., "A 3.3 V 32 Mb NAND Flash Memory with Incremental Step Pulse Programming Scheme," Solid-State Circuits Conference, 1995. Digest of Technical Papers. 41st ISSCC, Feb. 15-17, 1995 IEEE International, pp. 128-129 and 350.

* cited by examiner

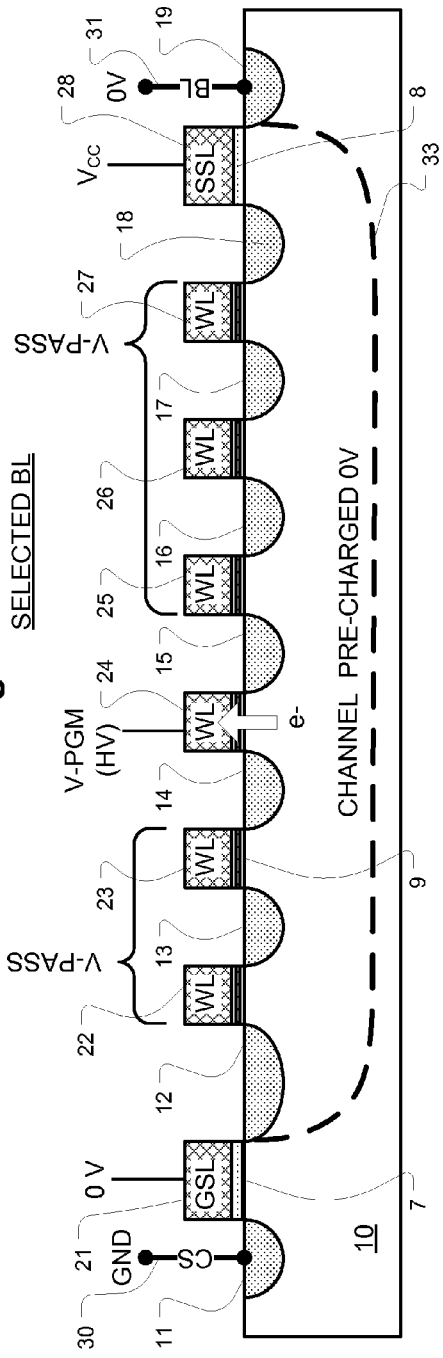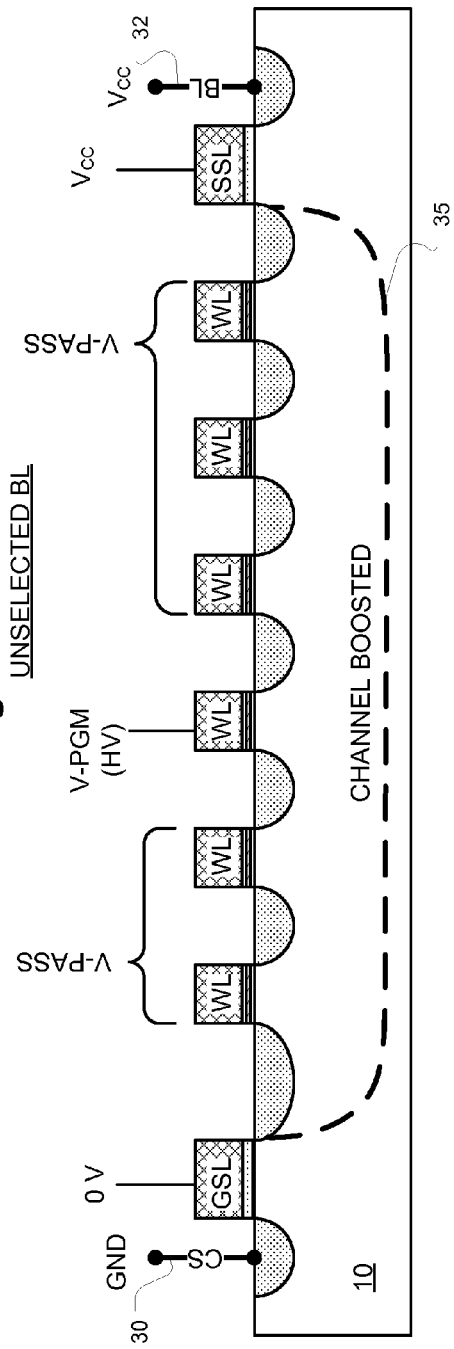

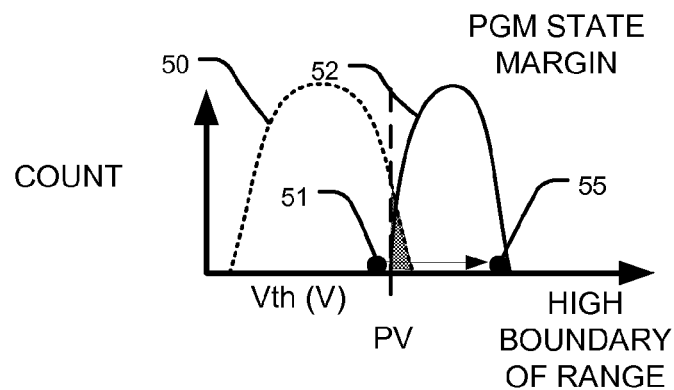
Fig. 2 - PRIOR ART
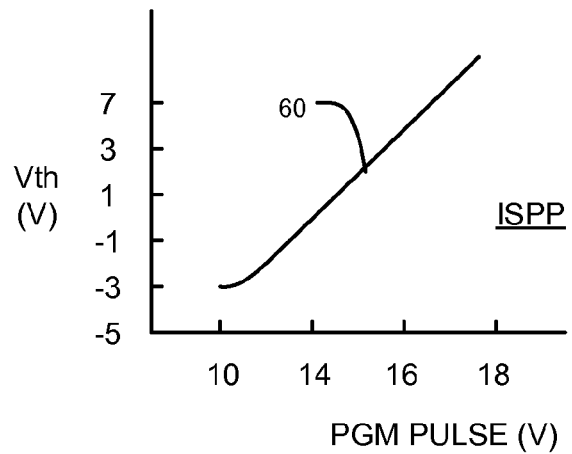
Fig. 3 - PRIOR ART
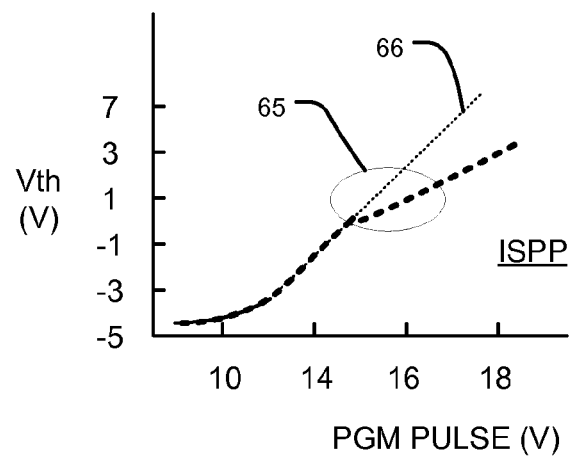
Fig. 4

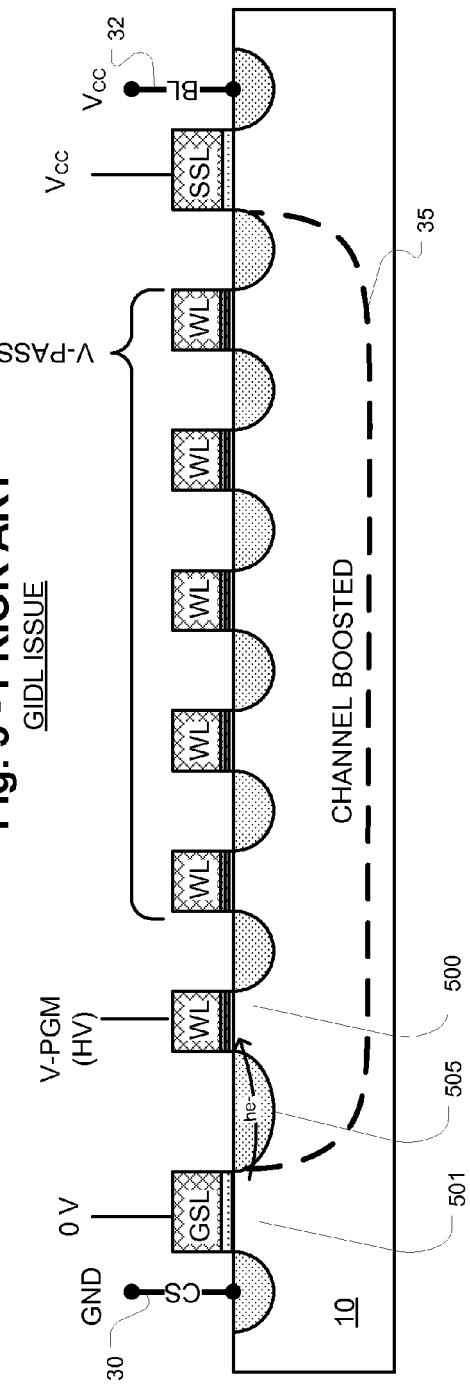
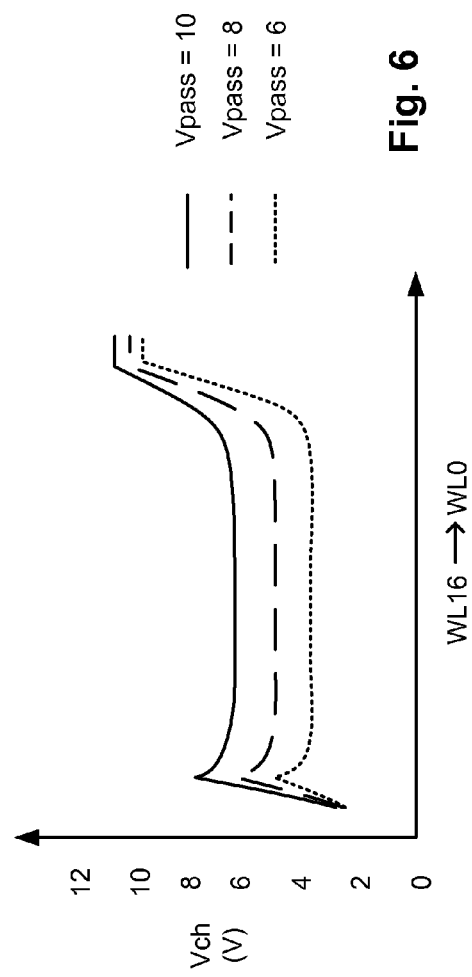

FLASH PROGRAMMING TECHNOLOGY FOR IMPROVED MARGIN AND INHIBITING DISTURBANCE

BACKGROUND OF THE INVENTION

1. Field of the Invention

The present invention relates to flash memory technology, and more particularly to flash memory suitable for high density implementations.

2. Description of Related Art

Flash memory is a class of non-volatile integrated circuit memory technology. Traditional flash memory employs floating gate memory cells. Another type of memory cell used for flash memory can be referred to as a charge trapping memory cell, which uses a dielectric charge trapping layer in place of the floating gate.

The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S).

Data is stored in a flash memory device by controlling the amount of charge trapped in the charge storage structure. The amount of charge stored sets a threshold voltage for the memory cell in flash memory devices, which allows the data to be read.

As specifications for the values of target threshold voltages tighten for low voltage applications, and for applications that store multiple bits per cell, problems are arising with precise control over the amount of charge stored in a target cell during a program operation, and with prevention of disturbance of the charge stored in the memory cells by program and erase operations directed at other cells.

It is desirable to provide a new memory technology that provides for finer control over the charge storage in flash memory.

SUMMARY

An integrated circuit is described including flash memory, that is configured for applying a program bias pulse implemented using a controller including:

biasing the bit lines and string select lines in a first condition;

setting a word line coupled to a target cell to a first voltage level while the bit lines and string select lines are in the first condition;

thereafter, biasing the bit lines and string select lines in a second condition; and setting the word line coupled to the target cell to a second voltage level higher than the first voltage level while the bit lines and string select lines are in the second condition.

A memory device is described configured for low voltage operation that includes a plurality of memory cells arranged in series in the semiconductor body, such as can be applied for a NAND string in a NAND array, having a plurality of word lines coupled to corresponding memory cells. Control circuitry is coupled to the plurality of word lines and to the semiconductor body adapted for programming a selected target memory cell, including applying program bias pulses for at least one cycle having a stepped profile, including an initial portion where the program voltage and pass voltage are set to an initial level, and a subsequent portion in which the program voltage and optionally the pass voltages are boosted to a second level. During the initial portion, the selected bit line voltage and the string select voltage are set to turn on the switch, and then in the subsequent portion, the selected bit line voltage and the string select voltage are shifted to turn off the switch.

A memory device is described configured so that the program voltage is ramped to a first magnitude less than the program magnitude on a leading edge of the program bias pulse, before the inhibit bit line voltage is applied to turn off the string select switch on the unselected strings, and then ramped to the program magnitude after the inhibit bit line voltage is applied to turn off the string select switch on the unselected strings.

Other aspects and advantages of the present invention can be seen on review of the drawings, the detailed description and the claims which follow.

BRIEF DESCRIPTION OF THE DRAWINGS

FIGS. 1A and 1B are simplified cross-sectional views of a selected NAND string and an unselected NAND string biased according to prior art FN tunneling programming techniques.

FIG. 2 is a graph showing the distribution of threshold voltages for a memory cell in a flash memory array in a simplified example, involving a state after an early program pulse in the sequence and a final distribution showing the program state margin for an ISPP programming sequence representative of the prior art.

FIG. 3 is a graph of threshold voltage versus the number of program pulses (reflected by the level of the program voltage during the program bias pulse), illustrating the ISPP slope commonly shown as a characteristic of incremental step pulse programming ISPP.

FIG. 4 is a graph of threshold voltage versus the number of program pulses for a modified ISPP technique.

FIG. 5 is a simplified cross-sectional view of an unselected NAND string biased according to prior art FN tunneling programming techniques (like FIG. 1B), where the target cell is adjacent the ground select line, and can be exposed to current from gate-induced drain leakage GIDL.

FIG. 6 is a graph of channel voltage along the body of the NAND string of FIG. 5, illustrating the conditions that cause GIDL disturbance.

DETAILED DESCRIPTION

Figure 7:
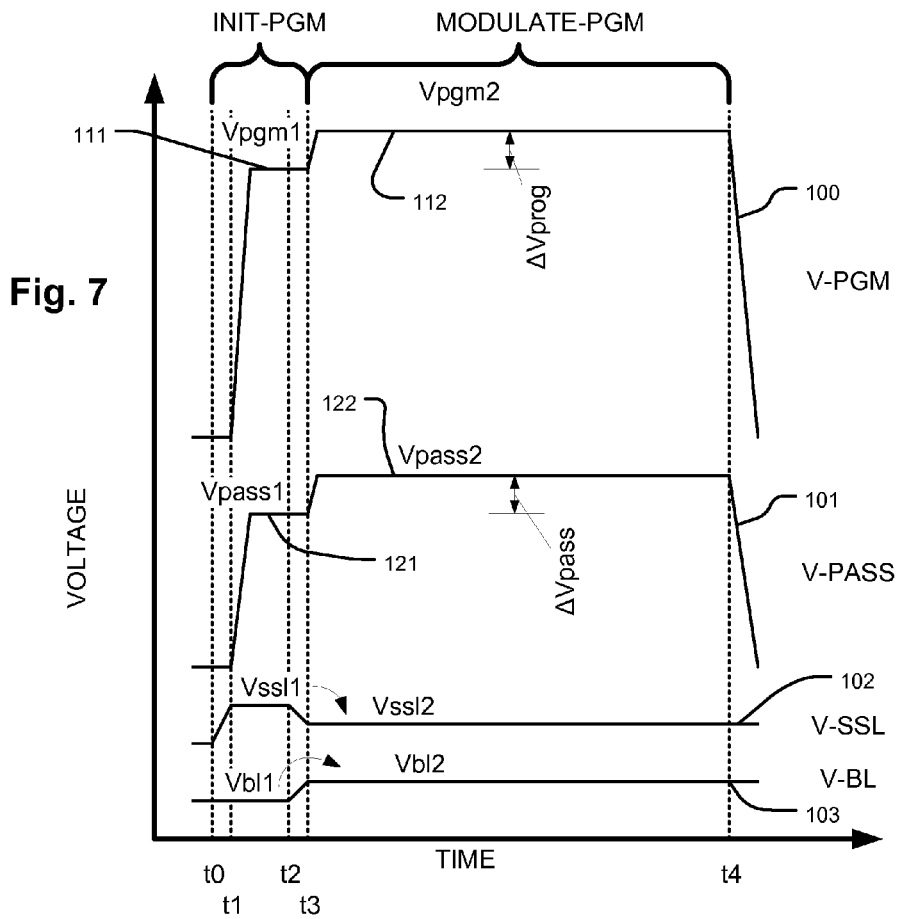
FIG. 7 is a graph of voltage versus time for a number of signals involved in applying a programming bias pulse to a flash memory cell, showing the program bias pulses applied as described herein.

A detailed description of embodiments of the present invention is provided with reference to the FIGS. 1-19.

FIGS. 1A and 1B show in cross-section a plurality of flash memory cells arranged in series to form a NAND string and biased for Fowler-Nordheim FN tunneling programming, as is typical in prior art NAND architecture flash memory. FIG. 1A shows the biasing for a NAND string that includes a target cell on a selected bit line, while FIG. 1B shows the biasing for a NAND string on an unselected bit line. NAND flash is typically implemented using floating gate technology. Another technology for implementation of NAND flash using bandgap engineered SONOS (BE-SONOS) charge trapping technology is described in U.S. Pat. No. 7,315,474 by Lue, which is incorporated by reference as if fully set forth herein. NAND strings can be implemented in a variety of configurations, including finFET technology, shallow trench isolation technology, vertical NAND technology and others. See, for an example, vertical NAND structures, European Patent Application No. EP 2 048 709 by Kim et al. entitled "Non-volatile memory device, method of operating same and method of fabricating the same." A similar structure is used for floating gate memory cells, using conductive floating gates.

Referring to FIG. 1A, the memory cells are formed in a semiconductor body 10. For n-channel memory cells, the semiconductor body 10 can be an isolated p-well, within a deeper n-well in a semiconductor chip. Alternatively, the semiconductor body 10 can be isolated by an insulating layer or otherwise.

The plurality of flash memory cells is arranged in a string extending in a bit line direction, orthogonal to word lines. Word lines 22-27 extend across a number of parallel NAND strings. Terminals 12-18 are formed by n-type regions (for n-channel devices) in the semiconductor body 10, and act as the source/drain regions for the memory cells. A first switch formed by a MOS transistor (i.e., first switch transistor) having a gate in a ground select line GSL 21, is connected between the memory cell corresponding with first word line 22 and a contact 11 formed by an n-type region in the semiconductor body 10. The contact 11 is connected to a common source CS line 30. The CS line 30 is an example of a "reference node" as the term is used herein. A second switch formed by a MOS transistor (i.e., second switch transistor) having a gate in a string select line SSL 28 is connected between the memory cell corresponding to the last word line 27 and a contact 19 formed by an n-type region in the semiconductor body 10. The contact 19 is connected to a sensing node, such as bit line BL 31. The BL 31 is an example of a "sensing node" as the term is used herein. The first and second switches in the illustrated embodiment are MOS transistors, having gate dielectrics 7 and 8 formed by, for example, silicon dioxide.

In this illustration, there are six memory cells in the string for simplicity. In typical implementations, a NAND string may comprise 32, 64 or more memory cells arranged in series. The memory cells corresponding to the word lines 22-27 have charge trapping structures 9 between the word lines and channel regions in the semiconductor body 10. The charge trapping structures 9 in the memory cells can be dielectric charge trapping structures, floating gate charge trapping structures, or other flash memory structures suitable for programming using techniques described herein. Also, embodiments of NAND flash structures have been developed which are junction-free, where the terminals 13-17, and optionally terminals 12 and 18, may be omitted from the structure.

FIG. 1A shows a program bias pulse according to a typical prior art technology to induce FN tunneling to program the memory cell corresponding with word line 24 (target cell) and as used in typical ISPP techniques. According to the biasing illustrated, the GSL is biased to about zero volts while the common source line is grounded, so that the first switch corresponding to the GSL line 21 is off, and the SSL is biased to about $V_{CC}$ while the selected bit line is grounded, so that the second switch corresponding to the SSL line 28 is on. In these conditions, the channel in the region 33 associated with the NAND string is precharged to about 0 Volts. The selected word line 24 receives a program pulse having a magnitude at a high voltage programming level V-PGM. The unselected word lines 22, 23 and 25-27 receive a pass pulse having a magnitude at a pass voltage V-PASS, which is less than V-PMG by an amount that inhibits programming in unselected memory cells in the string. As a result, electrons tunnel into the charge trapping structure of the selected memory cell during the program pulse.

FIG. 1B shows the biasing according to prior art technology at unselected bit lines for NAND strings which share the word lines 22-27 with the string shown in FIG. 1A. As can be seen, the GSL, the SSL and all of the word lines have the same bias voltages as shown in FIG. 1A. Likewise, the CS line 30 is grounded. However, the unselected bit line BL 32 is biased to a level about $V_{CC}$. This turns off the second switch, which corresponds with the SSL line, and decouples the channel in the region 35 from the unselected bit line BL 32. As a result, the channel in the region 35 is boosted by capacitive coupling from the voltages applied to the word lines 22-27, which prevents formation of electric fields sufficient to disturb the charge trapped in the memory cells in the unselected NAND string.

ISPP is a well known technique described in Suh et al., "A 3.3V 32 Mb NAND Flash Memory with Incremental Step Pulse Programming Scheme," IEEE International Solid-State Circuits Conference, 1995, page 128-130. According to the basic technique, in order to program a target memory cell to achieve a threshold within a range representing a particular data value, a sequence of program/verify steps are executed, in which each program pulse in the sequence has a magnitude stepped up relative to the previous pulse by a constant increment. Between each pulse, a program verify potential is applied to the word line of the cell, and the data is sensed, to determine whether the cell threshold exceeds the program verify level. The program verify level is set at the low end of the range suitable for the target data value.

FIG. 2 is a graph showing a dynamic of ISPP, simplified to show a distribution 50 that can occur during an early pulse in an ISPP sequence and a distribution 52 showing a final range of threshold voltage. Most of the cells in the distribution 50 are below the program verify PV threshold, including a cell having a threshold at point 51 which is very near to the PV threshold. As seen in this diagram, cells in the shaded region pass verify and are not subject to a following program pulse. However, all the cells below the threshold are subject to one or more extra program pulses. The final distribution 52 of threshold voltages is wide enough to include the threshold voltage at point 55 that corresponds with an increase in threshold after a following program pulse by an amount that leaves the cell threshold below the high boundary of the target distribution 52. As can be seen, the distribution 52 is constrained to be relatively wide to encompass the increase from point 51 to point 55.

One characteristic of the typical ISPP programming technique is shown in FIG. 3, which is a graph of threshold voltage versus program pulse height during an ISPP sequence. Typically, the increments in program potential for the succeeding pulses are set so that the slope of the trace 60 is about 1, and so that the threshold shifts by an amount that is a function of that slope and the starting threshold voltage at each step. The ISPP slope is a characteristic indication of the change in threshold voltage that occurs on each step.

FIG. 4 illustrates limitations of a modified ISPP programming technique described in Park et al., "A 7 MB/s 64 Gb 3-Bit/Cell DDR NAND Flash Memory in 20 nm-Node Technology," IEEE International Solid-State Circuits Conference, 2011, pages 212-213. FIG. 4 illustrates the trace for a typical ISPP sequence on line 66, which shows the characteristic constant slope. According to Park et al., when the cell is programmed over a preliminary program verify level, the bit line bias is increased slightly during the next program pulse on the target string before the final program verify level is reached. This suppresses tunneling, and reduces the slope of the ISPP graph in the region 65. See, FIG. 11.8.3 of Park et al. As explained in Park et al., in this condition, the program distribution can be narrower. However, although the slope is reduced in the region 65, the effect of the increased bit line bias is effective only for a small number of pulses, after which the slope will increase again. This small range of effective ISPP slope modification limits the effectiveness of the Park et al. procedure.

FIG. 5 is a simplified cross-section of a NAND string, showing the biasing at an unselected bit line which shares the word lines 22-27 with a selected string, and in which the target cell 500 is adjacent to the GSL switch transistor 501, and has a channel boosted to a high potential. This situation can cause gate-induced drain leakage GIDL that causes hot hole generation in the vicinity of the memory cell, as described by Jae-Duk Lee et al., "A New Programming Disturbance Phenomenon In NAND Flash Memory By Source/Drain Hot-Electrons Generated By GIDL Current," IEEE 21st Non-Volatile Semiconductor Memory Workshop (NVSMW), 12-16 Feb. 2006, pp. 31-33. As described in Lee et al., the V-PGM pulse applied near the GSL line can create a relatively high electric field between the cell 500 (sharing the selected word line with a target cell) and the switch transistor 501. Gate-induced drain leakage at the switch transistor causes the formation of electron-hole pairs. Because of the high electric fields, electrons gain energy that can be sufficient for hot electron tunneling in the memory cell on the unselected line that receives the program potential, thereby disturbing the charge stored in unselected cells.

FIG. 6 shows the results of simulation of the channel voltage for an unselected string. In the graph in FIG. 6, the word lines adjacent the GSL line are on the right (opposite of the arrangement in FIG. 5). As can be seen, very high partial local boosting can occur, because the locally boosted channel potential cannot be shared to the neighboring cell. It may be due to a condition in which the S/D junction 505 has been fully depleted as the bias is high; or due to insufficient gate-overdrive of the neighboring cell, which has been programmed high.

FIG. 7 illustrates the program voltage, pass voltage, string select line voltage, and bit line voltage for a program bias pulse used for a modified ISPP sequence, having a reduced slope for the ISPP graph. The pulses are illustrated one above the other for clarity. The voltage level at the beginning (time t0) of each pulse is about ground in this example. Trace 100 is a program voltage pulse applied to the word line of the selected memory cell. Trace 101 is a pass voltage pulse applied to the unselected word lines. Trace 102 shows the voltage pulse applied to the string select line SSL for the target string. Trace 103 shows the bit line voltage BL for the target string, during the program pulse. The common source voltage and the GSL voltage are set at ground in this example, having the effect of turning off the GSL switch, and decoupling the selected and unselected strings from the common source line. For a given program bias pulse in the modified ISPP sequence, at time t0, traces 100, 101, 102 and 103 are at ground level. At time t0, the voltage on the SSL line is increased to Vssl1, which is typically $V_{CC}$, reaching that level at about time t1. At time t1, the voltage on traces 100 and 101 both began to increase to their respective first levels 111, 121. The level 111 is set at a voltage that depends on the cycle of the ISPP sequence which is being executed, ranging from about 15 to about 22 V. The level 121 is set at a voltage sufficiently high to keep the channel of the unselected transistors on, but low enough to inhibit programming for unselected cells, typically from about 5 to 10 V. The voltage on an SSL line shown on trace 102 remains at $V_{CC}$ until time t2. Thus, in the interval between the time between t0 and t1 that the SSL switch turns on, until at least time t2, the channel for the selected string remains connected to the grounded bit line, and remains at ground potential. These conditions in the initial stage INIT-PGM of the program bias pulse of FIG. 7 are the basic conditions for inducing FN tunneling as applied during ISPP sequences. The time between t1 and t2 should be sufficient for the Vpass1 and Vpgm1 voltage levels to settle on the word lines. During this initial portion of the pulse, FN programming for the selected cell is weak because the voltage level is chosen to match those of a preceding normal ISPP pulse, after that preceding pulse has been applied to increase the threshold. As a result of the higher threshold caused by the preceding pulse, the programming in the initial portion of the pulse is less efficient.

At time t2, the voltage on the SSL line is dropped to an intermediate level at time t3. At about time t2, the voltage on the selected bit line is increased, reaching the level Vbl2 at about time t3. These changes in the voltage on the SSL line and on the selected bit line cause the SSL switch to turn off, or to decrease its conductivity, so as to reduce, or turn off, the current flow in the selected string by about time t3. Other voltage level adjustments can be applied to the SSL line and bit line to achieve this result. The difference between Vssl2 and Vbl2 can be set less than the threshold voltage for the string select transistor (Vssl2−Vbl2<Vt (SSL Transistor)) to achieve this result. At time about time t3, the pass voltage applied to the unselected cells is increased by an increment ΔVpass to level 122. Also, at about time t3, the program voltage applied to the selected cell is increased by an increment ΔVprog, to a level 112, starting a modulated programming MODULATE-PGM stage of the program bias pulse. Because both the GSL switch and the SSL switch are off, or substantially so, at time t3, the boosts in the levels of the program voltage by ΔVprog and the pass voltage by ΔVpass are capacitively coupled to the channel, boosting the effective channel voltage, and slowing down the FN tunneling current during the subsequent part of the program pulse. The channel potential will be boosted by an amount about $\beta_0 \ast \Delta$Vpass, where $\beta_0$ is smaller than 1, and a factor determined by the capacitive coupling of the cell. There remains a voltage drop between the control gate and the channel of about $(1-\beta_0)$ ΔVprog, if ΔVprog is equal to ΔVpass. During this time interval, the FN programming still occurs, but is made less efficient, modulating the ISPP slope.

At the end of the program bias pulse at time t4, both the program voltage on trace 100 and the pass voltage on trace 101 return to ground. Likewise, the SSL voltage and bit line voltage also return to ground at about time t4 or thereafter. In one experiment, the time between t0 and t2 was about 1 microsecond, and the time between t2 and t4 was about 9 microseconds, while the pulse width for a standard ISPP program bias pulse was about 10 microseconds. Of course, other time intervals can be applied as suits a particular circuit implementation.

Figure 17:
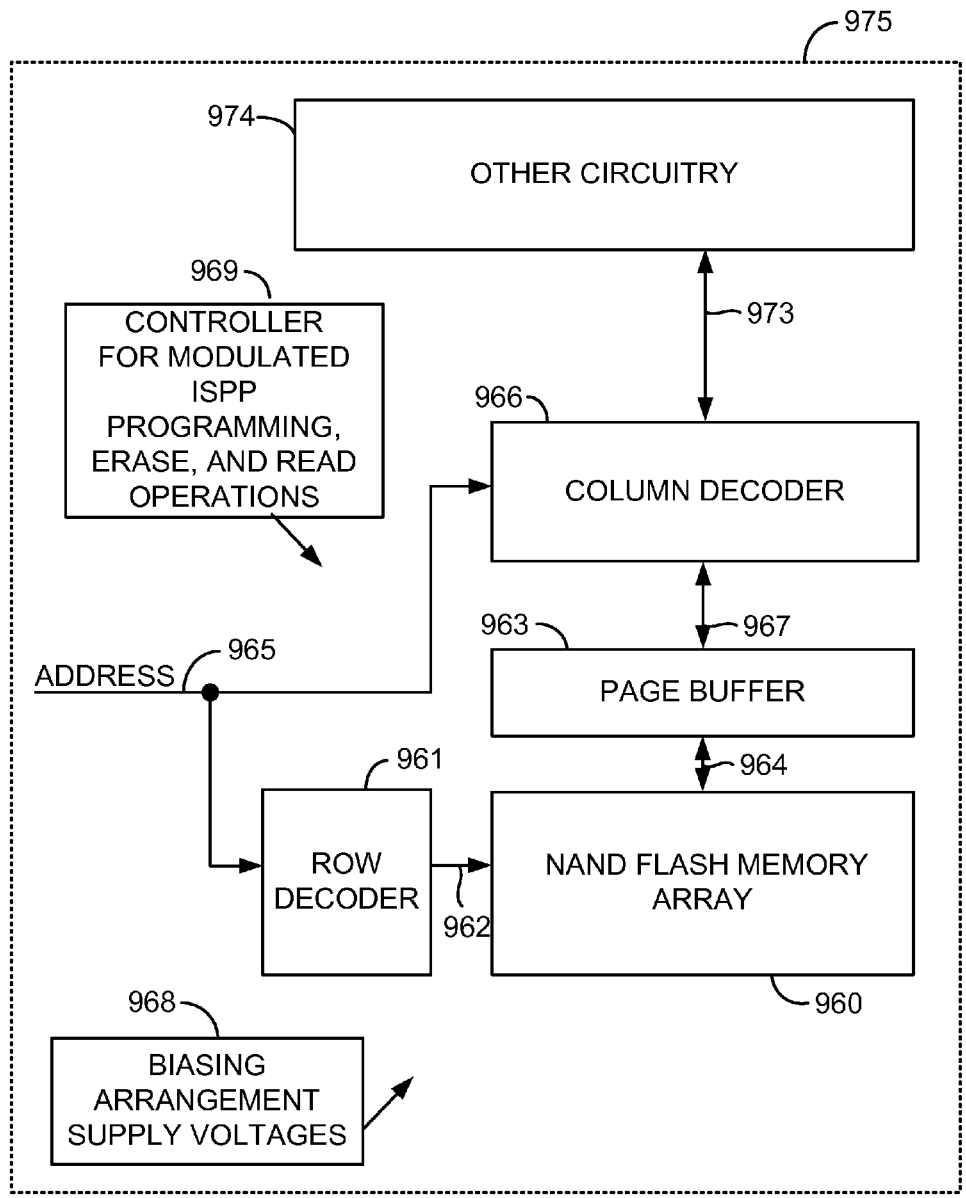
FIG. 17 is a block diagram of an integrated circuit memory employing memory cells and bias circuitry according to embodiments of the present invention.

Thus, a method for applying a program bias pulse implemented using a controller on an integrated circuit as shown in FIG. 17, is described including:

biasing the bit lines and string select lines in a first condition (e.g. conditions of time t1 to t2);

setting a word line coupled to a target cell to a first voltage level (e.g. Vpgm1) while the bit lines and string select lines are in the first condition;

thereafter, biasing the bit lines and string select lines in a second condition (e.g. conditions of time t3 to t4); and setting the word line coupled to the target cell to a second voltage level (e.g. Vpgm2) higher than the first voltage level while the bit lines and string select lines are in the second condition.

In this embodiment, the first condition includes setting a bit line voltage Vbl1 on a selected bit line and a voltage Vssl1 on a selected string select line for a selected string to couple the selected string to the bit line; and the second condition includes setting the bit line voltage Vbl2 on the selected bit line and the voltage Vssl2 on the selected string select line to decouple the selected string from the bit line. An initial programming level is set during the first condition, and a boosted programming level is set during the second condition.

In the example shown in FIG. 7, ΔVprog is equal to ΔVpass. However, the channel voltage change ΔVch relative to an initial channel voltage Vchini can be represented by the following equation (where N is the number of word lines in the string):

$$\Delta Vch \approx Vchini + \frac{N-1}{N} \cdot \beta \cdot \Delta V_{pass} + \frac{1}{N} \cdot \beta \cdot \Delta V_{prog}$$

So the channel boosting is dominated by ΔVpass. If one desires to increase the channel boosting and thereby further reduces the ISPP slope, then the value of ΔVpass can be increased. For example, ΔVpass could be increased to twice ΔVprog.

Figure 8:
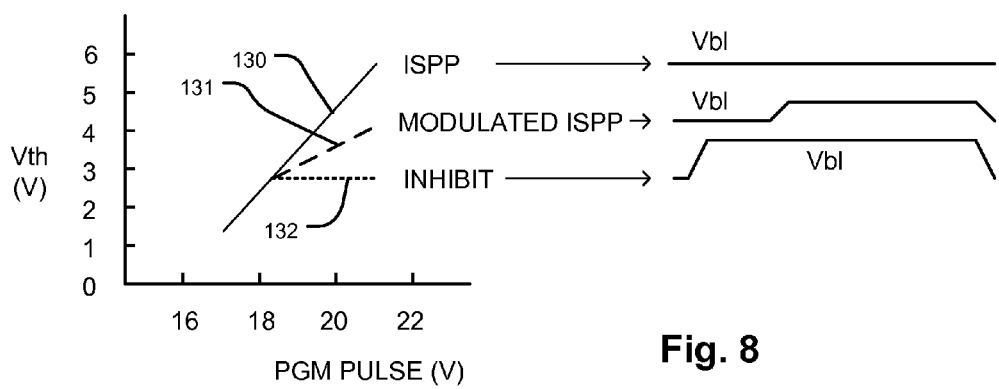
FIG. 8 is a graph of threshold voltage versus the number of program bias pulses, which compares the threshold voltage curves for typical ISPP programming, two-phase ISPP programming modulated as described herein, and ISPP inhibit for cells on unselected strings.

FIG. 8 is a graph of the threshold voltage versus program pulse count characteristic achieved by applying pulses like that shown in FIG. 7, as compared to a typical ISPP pulse. A typical ISPP pulse characteristic has a slope as illustrated on trace 130. The trace 131 illustrates that the slope achieved using the modified program bias pulse, like that described with reference to FIG. 7, is less than the slope on trace 130 so that smaller increments in threshold voltage can be induced. Trace 132 shows the slope achieved by an inhibit bias that is applied to an unselected string. As illustrated, during the typical ISPP sequence, the bit line voltage is held constant at about ground. During the modulated ISPP sequence based on the bias like that of FIG. 7, the bit line voltage remains at ground during an initial interval of the pulse, and then is increased slightly during a subsequent interval of the pulse in coordination with lowering the SSL line voltage V-SSL, to quickly turn off the SSL switch using small voltage swings. During the inhibit bias, the bit line voltage is set to a high value of about $V_{CC}$ at the beginning and, as a result, the full magnitudes of the pass voltage pulse and the program voltage pulse are capacitively coupled to the channel of the unselected string.

Figure 9:
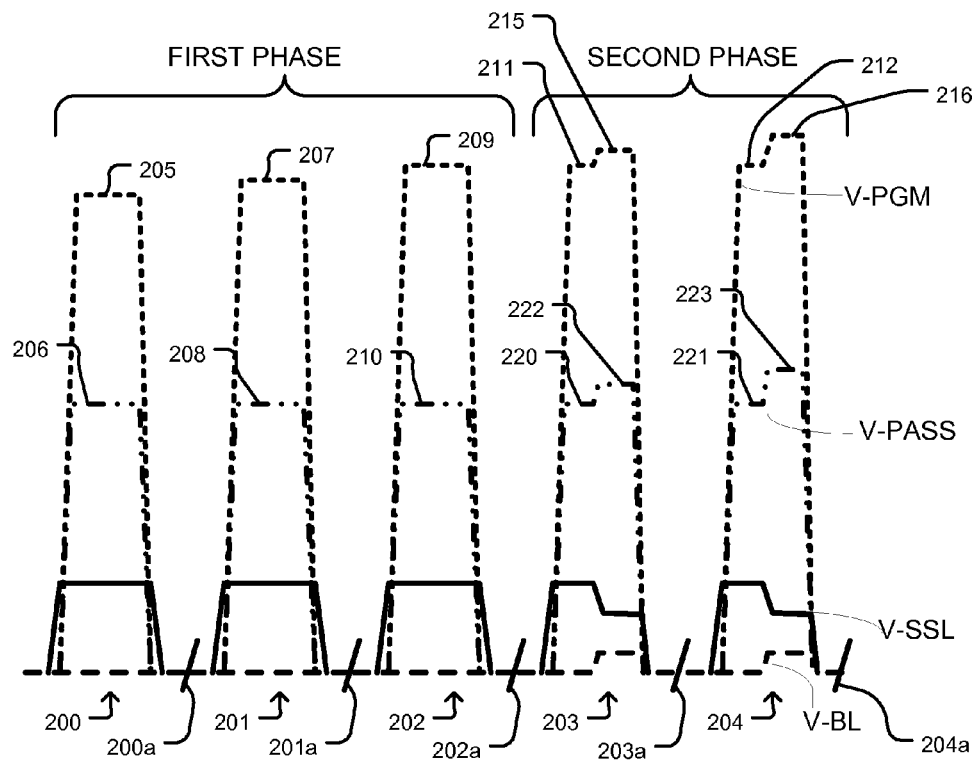
FIG. 9 is a graph showing a sequence of program pulses for a two-phase ISPP programming sequence as described herein.

FIG. 9 shows a two-phase, modified ISPP sequence employing the techniques described herein. During the first phase, a sequence of pulses is applied using a bias arrangement like that of a typical ISPP, where the bit line is maintained at about ground potential, the SSL line is driven to about $V_{CC}$, the word lines for unselected cells are driven to a pass voltage level, and the word line for the selected cell is driven to a program potential. FIG. 9 shows three program bias pulses in the first phase, including pulse 200, pulse 201 and pulse 202. After each pulse 200, 201, 202, a program verify cycle is applied represented by the symbols 200a, 201a and 202a. The verify potential used during the program verify cycle following each of the three pulses can be about equal at a pass voltage level Vpass (levels 206, 208, 210). The program potential voltages for the three pulses are incrementally increased, so that pulse 200 has a program potential at level 205, pulse 201 has a program potential at level 207, and pulse 202 has a program potential at level 209. While applying program pulses during the first phase, the ISPP slope is about constant as shown in the initial part of the trace 130 in FIG. 8.

In a second phase of the programming cycle starting with program bias pulse 203, the modulated programming biases are applied like that described with reference to FIG. 7. In pulse 203, the bit line voltage is ground during an initial portion of the pulse, and then increased slightly during a subsequent portion of the pulse. The SSL voltage V-SSL is about $V_{CC}$ during the initial portion, and decreased slightly during a subsequent portion of the pulse. The bit line voltage V-BL remains low, at ground for example, during the initial portion, and is increased slightly during a subsequent portion of the pulse. The pass voltage is increased to a first level 220 during an initial portion of the pulse, and then boosted to level 222 during a subsequent portion of the pulse. The first level 220 can be about the same as the level 210 of the verify voltage used during the last pulse of the first phase. Also, the program voltage during pulse 203 is increased to a first level 211 during an initial part of the pulse, and then boosted to a level 215 during a subsequent portion of the pulse. In this example, the level 211 is about the same as the level 209 for the program voltage during the last pulse 202 of the first phase of the ISPP sequence. The transitions from the voltage levels in the initial portion of the pulse to the voltage levels in the subsequent portion are preferably aligned in time as illustrated in the figure. As described above, the first pulse of the second phase is followed by a program verify cycle 203a. If the cell does not pass the verify cycle, then a subsequent pulse is applied.

FIG. 9 also shows a second pulse 204 in the second phase of the programming cycle. In pulse 204, the bit line voltage V-BL and SSL voltage are modulated as described with reference to FIG. 7. The pass voltage applied to unselected word lines is boosted first to a level 221 during an initial portion of the pulse, and then boosted to level 223 in a subsequent portion of the pulse. The level 221 in this example can be about the same as the level 220 in the previous pulse. However, the increment in the subsequent part of the program bias pulse in the pass voltage from level 221 to level 223 is increased relative to that in pulse 203, by a pass voltage increment configured for the algorithm. Also, the program voltage during program bias pulse 204 is increased to a first level 212 during an initial part of the pulse, and then boosted to a level 216 during a subsequent portion of the pulse 204 by a program voltage increment configured for the algorithm. In this example, the level 212 is about the same as the level 209 for the program voltage during the last pulse 202 of the first phase of the ISPP sequence. The program voltage increment in voltage from level 212 to level 216 is greater than that in the first pulse 203 from level 211 to level 215. The transitions from the voltage levels in the initial portion of the pulse to the voltage levels in the subsequent portion are preferably aligned in time as illustrated in the figure. As described above, the first pulse of the second phase is followed by a program verify cycle 204a. If the cell does not pass the verify cycle, then a subsequent pulse is applied. The process is repeated until the verify passes, or until a maximum number of retries is executed.

Figure 9A:
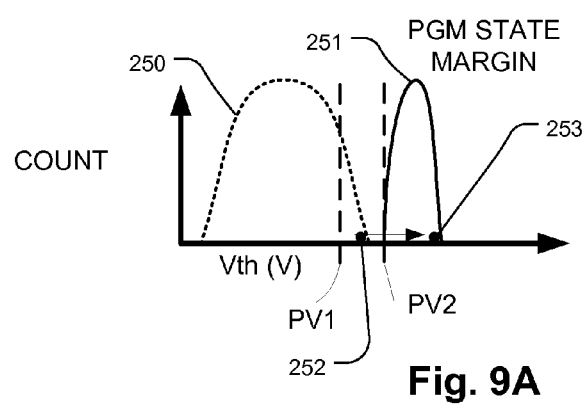
FIG. 9A is a graph showing the distribution of threshold voltages for a memory cell in a flash memory array in a simplified example, involving a state after an early program pulse in the sequence and a final distribution showing the more narrow program state margin for a modified ISPP programming sequence like that of FIG. 9.

FIG. 9A is a graph showing a dynamic of the modified ISPP, according to a process like that of FIG. 7. FIG. 9A shows a distribution 250 that can occur after a program bias pulse during a first phase of the modified ISPP sequence, while applying a preliminary program verify level (PV1). Some of the cells represented by distribution 250 will have a threshold exceeding PV1, and pass the first phase verify condition, and some cells will have thresholds lower than PV1. Also, FIG. 9A shows a more narrow distribution 251 showing a final range of threshold voltage which can occur during a second phase of the modified ISPP sequence. During the second phase of the modified ISPP sequence, a final or target program verify level (PV2) is applied. Cells in the distribution 250 which remain below the preliminary program verify threshold (PV1) can be programmed during the first phase, following the normal ISPP slope by grounding V-BL just as in the first option in FIG. 8 (ISPP trace 130). Cells whose Vt is higher than PV1 but lower than PV2, such as at point 252 at the high end of distribution 250, are subject to the second phase with modified ISPP operation, which can be modified as described herein to a lower ISPP slope. The final distribution 251 of threshold voltages shown is narrower than the distribution 52 of FIG. 2. This effect can be achieved during the second phase ISPP process, that operates with a lower ISPP slope, so that a cell having the threshold near point 252, when subject to a pulse during the second phase is unlikely to achieve an increase on threshold voltage beyond point 253 at the far end of distribution 251.

Figure 9B:
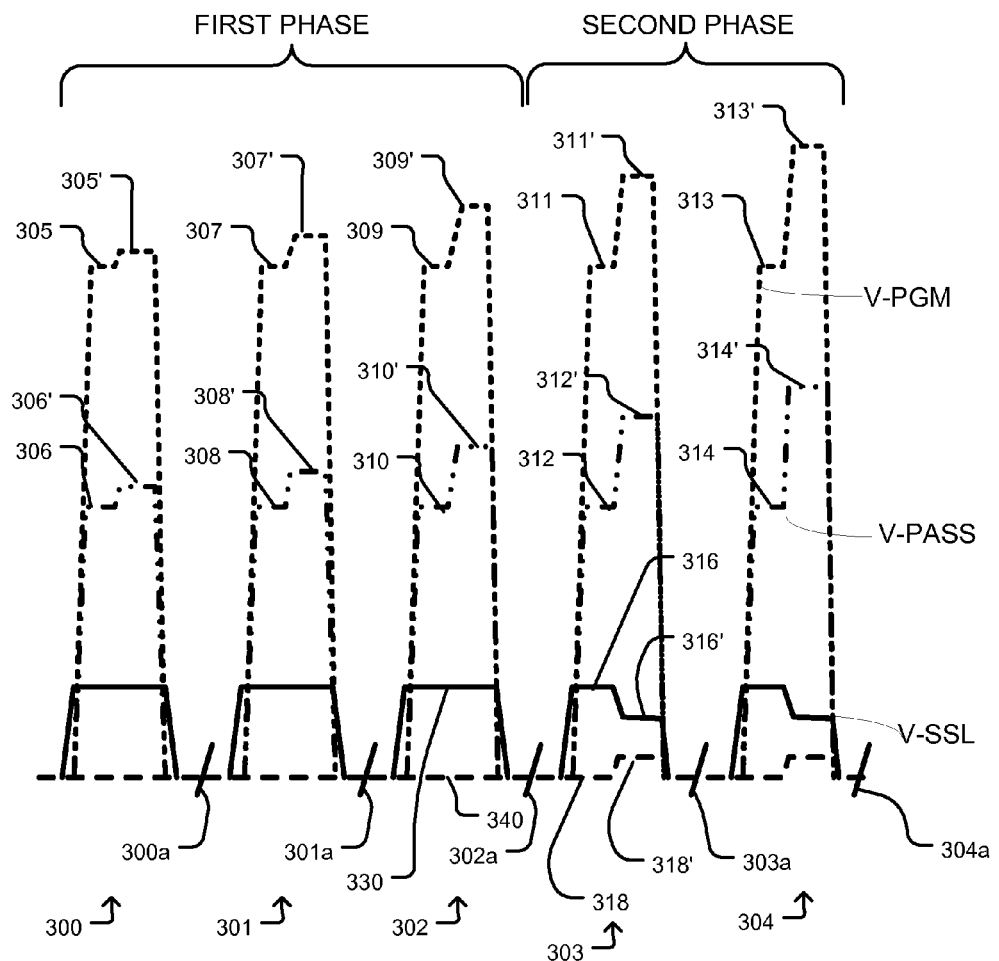
FIG. 9B is a graph showing an alternative sequence of program pulses for a two-phase ISPP programming sequence as described herein.

FIG. 9B shows an alternative two-phase, modified ISPP sequence employing the techniques described herein. During the first phase, a sequence of pulses is applied using a bias arrangement including stepped V-PASS and stepped V-VPM pulses, with level V-SSL pulses, while the bit line is maintained at about ground potential.

FIG. 9B shows three program bias pulses in the first phase, including pulse 300, pulse 301 and pulse 302. After each pulse 300, 301, 302, a program verify cycle is applied represented by the symbols 300a, 301a and 302a. The verify potential used during the program verify cycle following each of the three pulses can be set to a preliminary verify level PV1. The program potential voltages for the three pulses are stepped, including an initial portion at a constant level and subsequent portions that are incrementally increased, so that pulse 300 has a program potential at initial level 305 stepped to level 305', pulse 301 has a program potential at initial level 307 stepped to level 307', and pulse 302 has a program potential at initial level 309 stepped to level 309'. The initial levels 305, 307, 309 of the program potential voltages can be equal as illustrated. Likewise, the pass voltages applied during the first phase pulses 300, 301 and 302 are stepped, including an initial portion at a constant level and subsequent portions that are incrementally increased, so that pulse 300 has a pass potential at initial level 306 stepped to level 306', pulse 301 has a pass potential at initial level 308 stepped to level 308', and pulse 302 has a pass potential at initial level 310 stepped to level 310'. The initial levels 306, 308, 310 of the pass potential voltages can be equal as illustrated. During pulse 300, pulse 301 and pulse 302, the bit line voltage V-BL is set at a reference level 340 such as ground, while the string select gate is set at a constant level 330 such as $V_{CC}$ throughout the pulse, so that the string select transistor remains on. During the first phase, the program verify level applied in the program verify cycles 300a, 301a and 302a can be set at a preliminary level PV1, slightly lower than the target program verify level.

In a second phase of the programming cycle starting with program bias pulse 303, the modulated programming biases are applied like that described with reference to FIG. 7. In pulse 303, the bit line voltage V-BL is at level 318 which can be about ground during an initial portion of the pulse, and then increased slightly to level 318' during a subsequent portion of the pulse. The SSL voltage V-SSL is set at level 316 which can be about $V_{CC}$ during the initial portion, and decreased slightly to level 316' during a subsequent portion of the pulse. The pass voltage is increased to a first level 312 during an initial portion of the pulse, and then boosted to level 312' during a subsequent portion of the pulse. The first level 312 can be about the same as the levels 306, 308 and 310 of the verify voltage used during the first phase. Also, the program voltage during pulse 303 is increased to a first level 311 during an initial part of the pulse, and then boosted to a level 311' during a subsequent portion of the pulse. In this example, the level 311 is about the same as the level 309 for the program voltage during the last pulse 302 of the first phase of the ISPP sequence. The transitions from the voltage levels in the initial portion of the pulse to the voltage levels in the subsequent portion are preferably aligned in time as illustrated in the figure. As described above, the first pulse of the second phase is followed by a program verify cycle 303a. If the cell does not pass the verify cycle, then a subsequent pulse is applied. During the second phase, the program verify level applied in the program verify cycles 303a and 304a can be set at the target level PV2.

FIG. 9B also shows a second pulse 304 in the second phase of the programming cycle. In pulse 304, the bit line voltage V-BL and SSL voltage are modulated as described with reference to FIG. 7. The pass voltage applied to unselected word lines is boosted first to a level 314 during an initial portion of the pulse, and then boosted to level 314' in a subsequent portion of the pulse. The level 314 in this example can be about the same as the level 311 in the previous pulse. However, the increment in the subsequent part of the program bias pulse in the pass voltage from level 314 to level 314' is increased relative to that in pulse 303, by a pass voltage increment configured for the algorithm. Also, the program voltage during program bias pulse 304 is increased to a first level 313 during an initial part of the pulse, and then boosted to a level 313' during a subsequent portion of the pulse 304 by a program voltage increment configured for the algorithm. In this example, the level 313 is about the same as the level 309 for the program voltage during the last pulse 302 of the first phase of the ISPP sequence. The program voltage increment in voltage from level 313 to level 313' is greater than that in the first pulse 303 from level 311 to level 311'. The transitions from the voltage levels in the initial portion of the pulse to the voltage levels in the subsequent portion are preferably aligned in time as illustrated in the figure. As described above, the first pulse of the second phase is followed by a program verify cycle 304a. If the cell does not pass the verify cycle, then a subsequent pulse is applied. The process is repeated until the verify passes, or until a maximum number of retries is executed.

Figure 10:
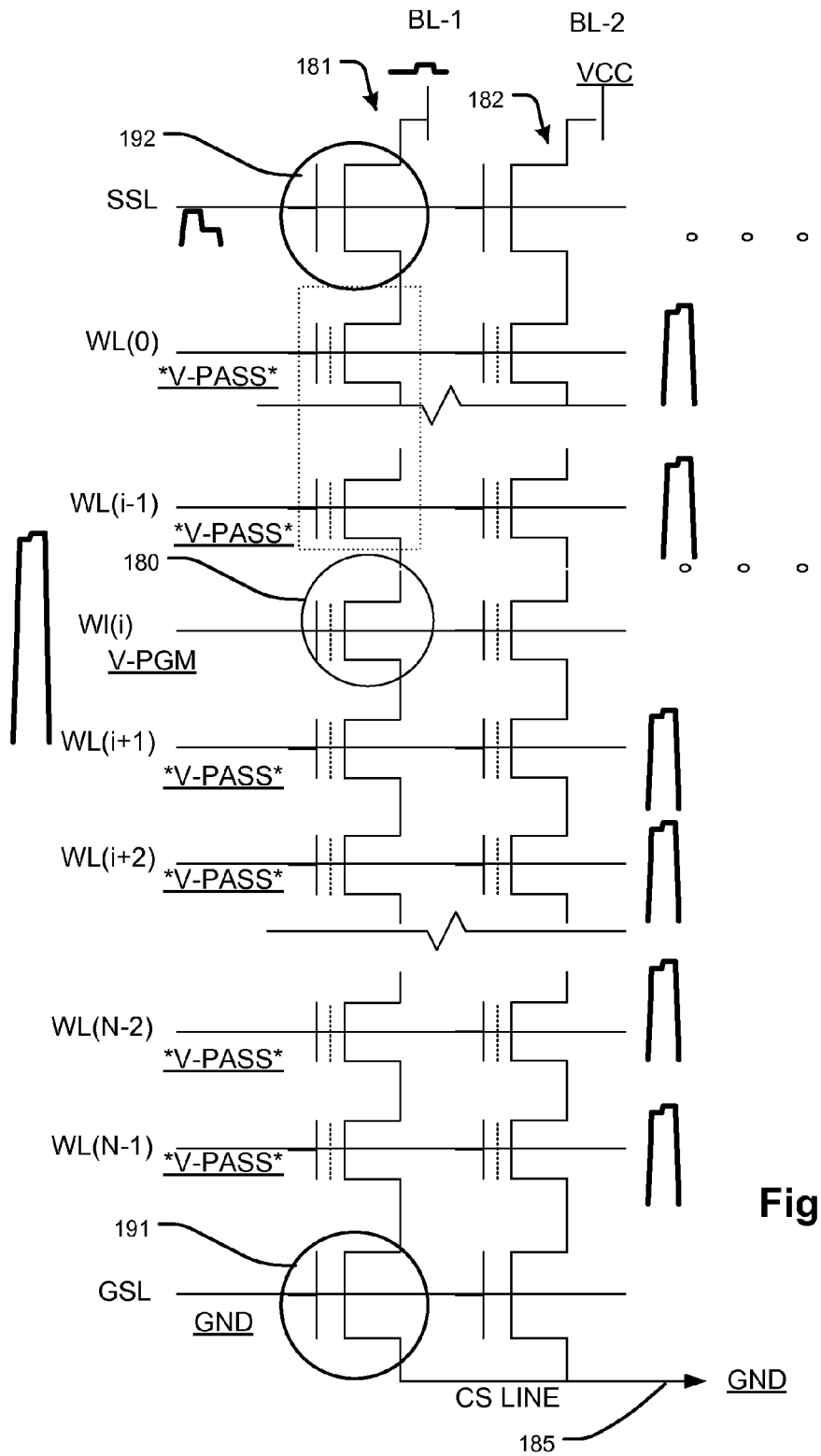
FIG. 10 is a schematic diagram of a NAND-type memory array employing a program bias operation as described herein.

FIG. 10 is a circuit diagram showing layout of two NAND strings 181, 182 which are coupled to respective bit lines BL-1 to BL-2 and to a common source CS line 185 by string select transistors and ground select transistors, respectively. The bias voltages are shown for modulated programming bias pulse for a target memory cell 180 on a corresponding word line WL(i) in the NAND string 181. The first switch transistor 191 receives a ground potential via the GSL line to decouple the NAND string from the grounded CS line 185. The second switch transistor 192 is biased by the modulated V-SSL pulse on the SSL line. The selected bit line BL-1 likewise receives the modulated V-BL voltage. The other word lines in the string WL(0) to WL(i−1) and WL(i+1) to WL(N−1) all receive the modulated V-PASS voltage. The unselected bit lines (e.g. BL-2) are coupled to $V_{CC}$, so that the unselected string is protected from program disturb by self-boosting.

Figure 11:
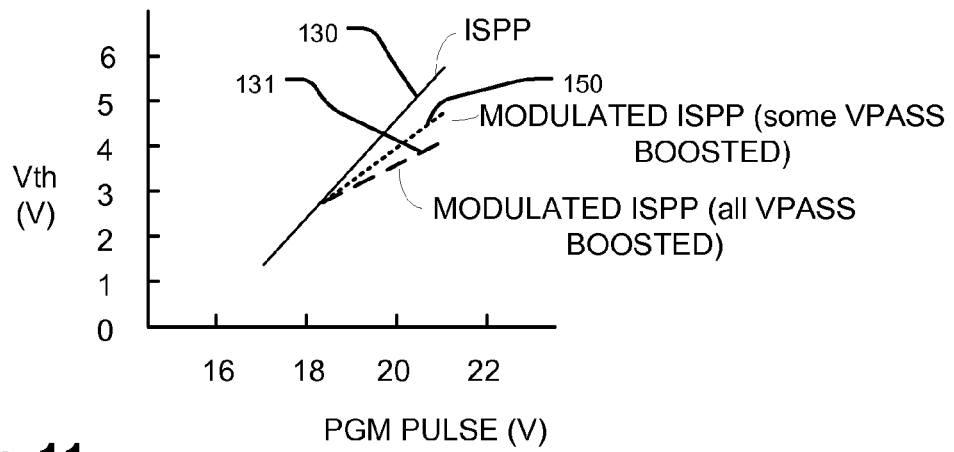
FIG. 11 is a graph of threshold voltage versus the number of program pulses, which compares the threshold voltage curves for typical ISPP programming, two-phase ISPP programming modulated to establish a first reduced ISPP slope, and two-phase ISPP programming modulated to establish a second reduced ISPP slope, where the second reduced ISPP slope is greater than the first reduced ISPP slope.

FIG. 11 is a graph of threshold voltage versus program pulse count illustrating additional modifications of the program bias pulses that can be applied to modify the flow of the ISPP sequence. The trace for a typical ISPP sequence is shown on line 130 like that of FIG. 8. The trace for the modulated ISPP as described above with respect to FIG. 8, in which all of the unselected word lines receive the boosted V-PASS pulse, is shown on line 131. The slope can be set at an intermediate value as shown on trace 150 by controlling the application of the stepped V-PASS bias to the unselected word lines on the string as shown for example in FIG. 13. For example, only some of the unselected word lines can receive the stepped V-PASS voltage pulse, like the pulse having levels 121 and 122 of FIG. 7, while others receive a pass voltage without the boosting stage in the subsequent part of the pulse. This results in less capacitive coupling to the channel, and programming current levels between that of lines 130 and 131.

Figure 12:
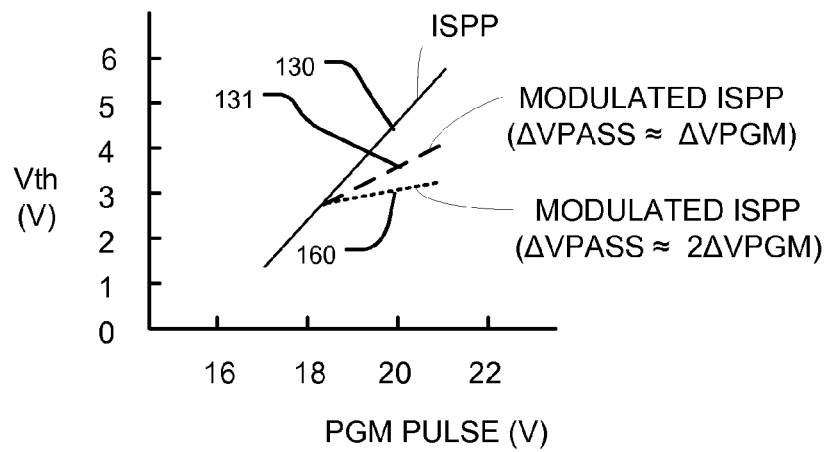
FIG. 12 is a graph of threshold voltage versus the number of program pulses, which compares the threshold voltage curves for typical ISPP programming, two-phase ISPP programming modulated to establish a first reduced ISPP slope, and two-phase ISPP programming modulated to establish a third reduced ISPP slope, where the third reduced ISPP slope is less than the first reduced ISPP slope.

FIG. 12 is a graph of threshold voltage versus program pulse count illustrating additional modifications of the program bias pulses that can be applied to modify the flow of the ISPP sequence. The trace for a typical ISPP sequence is shown on line 130, like that of FIG. 8. The trace for the modulated ISPP as described above with respect to FIG. 8, in which all of the unselected word lines receive the boosted V-PASS pulse, is shown on line 131. The slope for the modulated ISPP sequence can be reduced further than that shown by trace 160 by other modifications of the program bias pulse arrangement. In this example, the amount that the pass voltage is boosted, $\Delta Vpass$, can be set to values that are greater than $\Delta Vpgm$, including for example about twice $\Delta Vprog$. This results in increased capacitive coupling to the channel, and programming current levels lower than that of line 131.

Figure 13:
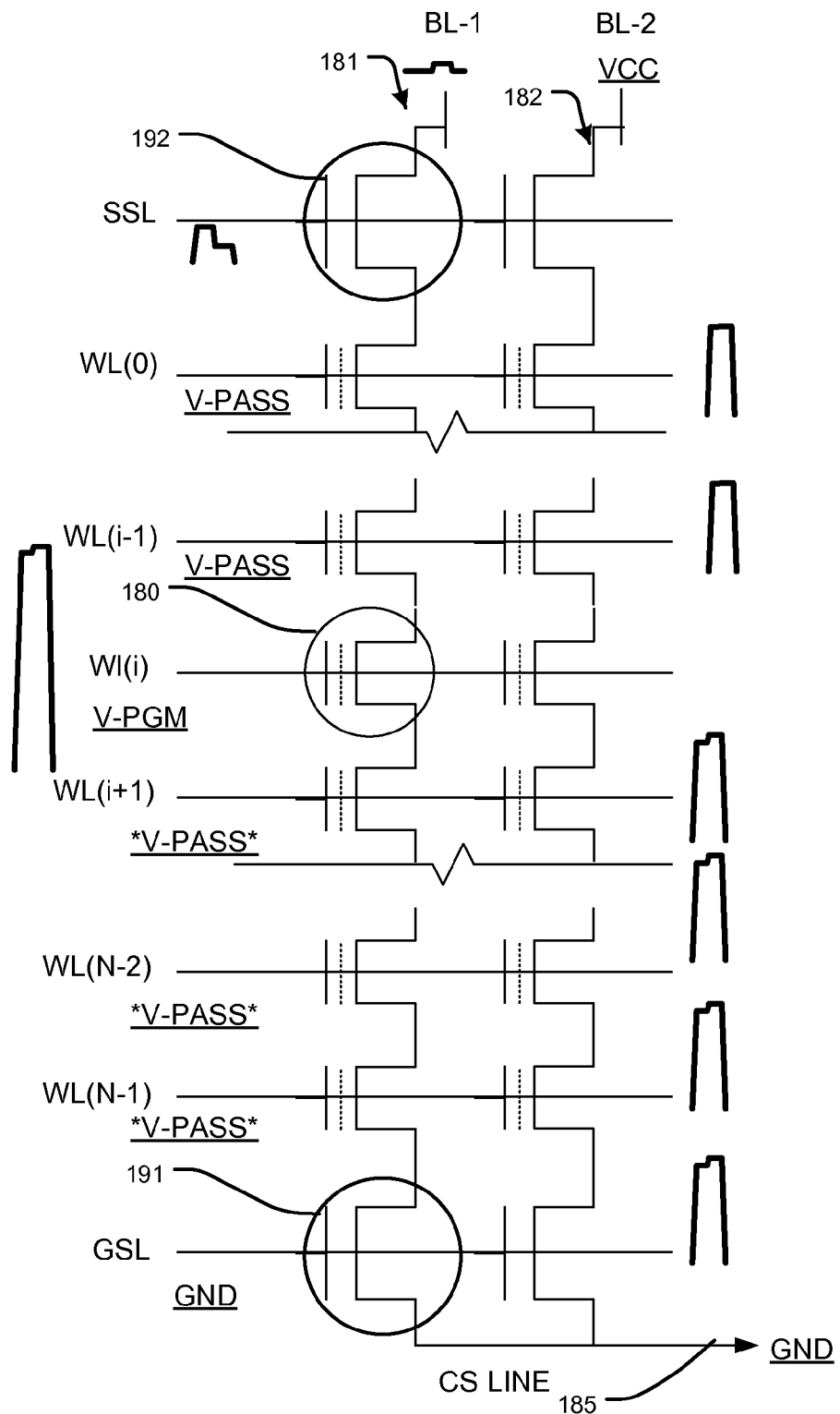
FIG. 13 is a schematic diagram of a NAND-type memory array employing a program bias operation as described herein, with stepped pass voltages applied to some, rather than all, of the word lines on the string.

FIG. 13 is a circuit diagram showing layout of two NAND strings 181, 182 like that of FIG. 10, which are coupled to respective bit lines BL-1 to BL-2 and to a common source CS line 185 by string select transistors and ground select transistors, respectively. The bias voltages are shown for a modulated programming bias pulse for a target memory cell 180 on a corresponding word line WL(i) in the NAND string 181. However, in this bias arrangement, the modulated pass voltages, designated in this figure by *V-PASS* are applied only on word lines WL(i+1) to WL(N−1), and the standard un-boosted pass voltages are applied on word lines WL(0) to WL(i−1), while the modulated program voltage is applied on the target word line WL(i), as explained above with reference to FIG. 11. This arrangement can be used to change the slope of the ISPP sequence as described with reference to FIG. 8, such as by setting the slope at an intermediate level on trace 150 between that accomplished by the arrangement of FIG. 8 and that accomplished by the typical ISPP sequence bias.

Figure 14:
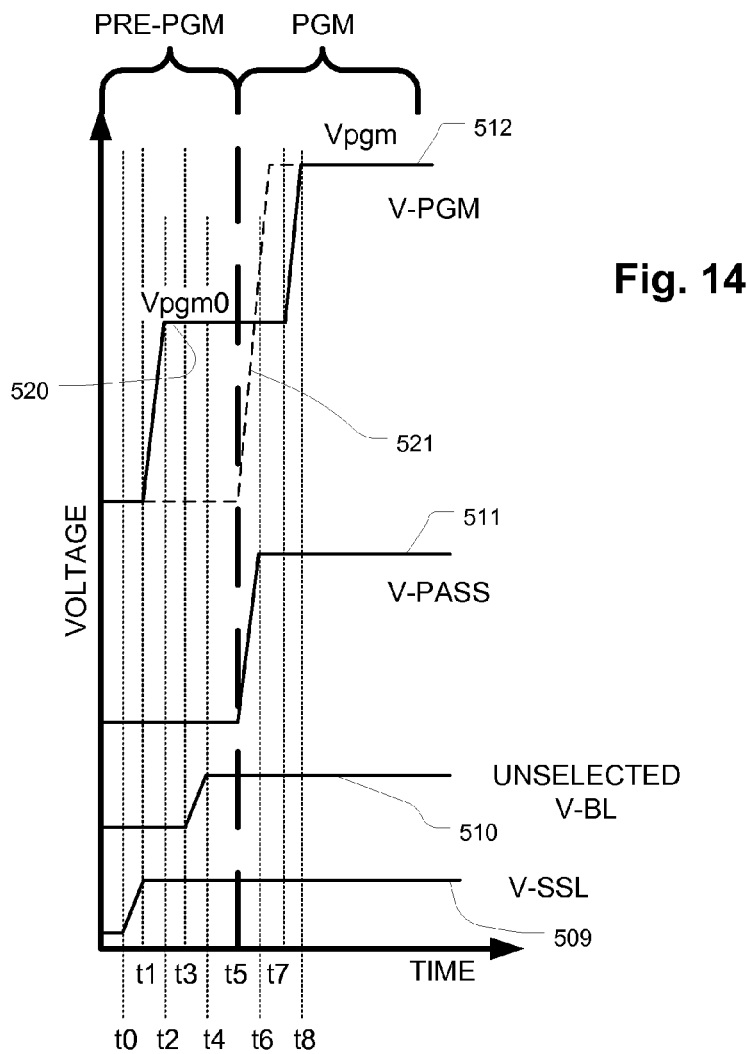
FIG. 14 is a graph of voltage versus time for a number of signals involved in programming a flash memory cell, showing the leading edge of signals that are part of a program bias pulse applied as described herein to suppress local self-boosting and consequent hot carrier disturb in unselected strings.

FIG. 14 illustrates a modification of the program bias pulse that can inhibit partial local self-boosting potential, and prevent gate induced drain leakage GIDL disturbance caused by the situation illustrated in FIGS. 5 and 6. In FIG. 14, the initial part of the bit line voltage 510 (UNSELECTED V-BL) and the initial part of the voltage 509 (V-SSL) on the SLL line in a program bias pulse on an unselected line is shown. Also, the initial part of the pass voltage 511 (V-PASS) in a program bias pulse on unselected word lines, and the initial part of the program voltage 512 (V-PGM) in a program bias pulse on a selected word line, are shown. In order to suppress partial local self-boosting, the leading edges of these voltages are modified. At time t0, the voltage V-SSL applied to the string select switch transitions to a level to turn on the switch, such as about $V_{CC}$ in this example. The common source line and the ground select switch are set to block current flow, such as by setting both to about 0 volts or ground. At time t1, the V-PGM voltage transitions to a level 520, which can be about the level of a pass potential, about 8 volts for example, or other level that should not be sufficient relative to the body of the target cell to induce tunneling current in the target cell. At this time, because the unselected bit line potential remains at ground in this example, the channel of the unselected line remains at about the ground level, and is not boosted. At time t2, the V-PGM voltage settles at level 520. At time t3, which can coincide with t2 in some examples, near the time, or after, the V-PGM voltage settles at level 520, the unselected bit line voltage transitions to the inhibit level, in this example about $V_{CC}$, which results in turning off the SSL transistor for the unselected line. During this interval, the voltage on the selected bit line remains at or near ground potential, and the SSL switch on the selected string is strongly on. In one example, length of the interval between t1 and t3 can be about 1 to 2 microseconds. The length should be long enough for the V-PGM voltage to settle at level 520. At time t4, the unselected bit line voltage settles at its target level, when the SSL transistor is off. At time t5, the pass voltage 511 is boosted to the pass potential (e.g. 8 to 10 volts) to be used during the program bias pulse, and settles at about time t6. Thereafter, at time t7, the program voltage 512 is boosted to a program level (e.g. about 20 volts) for the program bias pulse, and settles at about time t8. At times t5 and t7, the channel of the unselected string is floating, and capacitive boosting occurs to suppress program disturb according to the standard ISPP sequence. Also shown on trace 521 in FIG. 14 for reference is the timing of the programming pulse in a standard ISPP sequence, where the program voltage would transition at time t5, after the unselected string is floating.

As labeled in FIG. 14, the program bias pulse includes a pre-program stage PRE-PGM, in which the word line of the selected cell is precharged to an intermediate level Vpgm0 under conditions that do not cause boosting of the channel in the selected or in the unselected strings, and a program stage PGM in which the word line of the selected cell is boosted to a program level Vpgm, while the word line voltages of the unselected cells are boosted to a pass voltage level under conditions that do cause boosting of the channels in the unselected strings. However, the amount of boosting caused by the selected word line is much reduced, inhibiting GIDL as discussed above.

Therefore, a method for applying a program bias pulse implemented using a controller on an integrated circuit as shown in FIG. 17, is described, including:

biasing the bit lines and string select lines in a first condition (e.g. conditions of time t1 to t3);

setting a word line coupled to a target cell to a first voltage level (e.g. Vpgm0) while the bit lines and string select lines are in the first condition;

thereafter, biasing the bit lines and string select lines in a second condition (e.g. conditions of time t4 to t8); and setting the word line coupled to the target cell to a second voltage level (e.g. Vpgm) higher than the first voltage level while the bit lines and string select lines are in the second condition.

In this embodiment, the first condition includes setting a bit line voltage SELECTED V-BL on a selected bit line and bit line voltages UNSELECTED V-BL on unselected bit lines to $V_{CC}$ for example, and a voltage V-SSL on a selected string select line for a selected string to $V_{CC}$ for example, to couple the selected string to the bit line and the unselected strings to unselected bit lines. The second condition includes setting the voltage V-SSL on the selected string select line to $V_{CC}$ for example, setting the bit line voltage on the selected bit line to ground, to couple the selected string to the selected bit line, and setting bit line voltages UNSELECTED V-BL on unselected bit lines to $V_{CC}$ and decouple the unselected strings from the unselected bit lines. Thus, during the first condition, the voltage on the selected word line is raised to Vpgm0 without inducing boosting of the channels in the strings, and then during the second condition, the voltage on the selected word line is boosted to a program potential Vpgm and the unselected word lines are boosted to a pass potential Vpass, in a manner that does induce boosting of the channels in the unselected strings.

Figure 15:
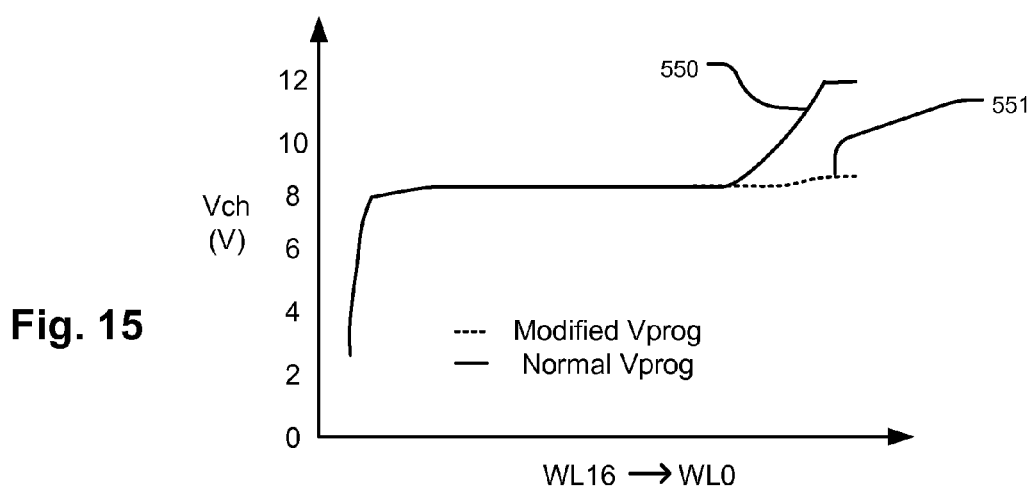
FIG. 15 is a graph showing the effect of using a program bias pulse with an initial part like that of FIG. 14, on the channel voltage of an unselected string.

FIG. 15 is a graph showing the effect of using a program bias pulse with an initial portion like that of FIG. 14, on the channel voltage of an unselected string. Without the modification, the channel voltage will have a profile like that of trace 550, with highly boosted levels near the GSL switch. With the modification, the boosting of the channel voltage is more uniform, as shown in trace 551. Accordingly, disturbance due to GIDL is inhibited.

Figure 16:
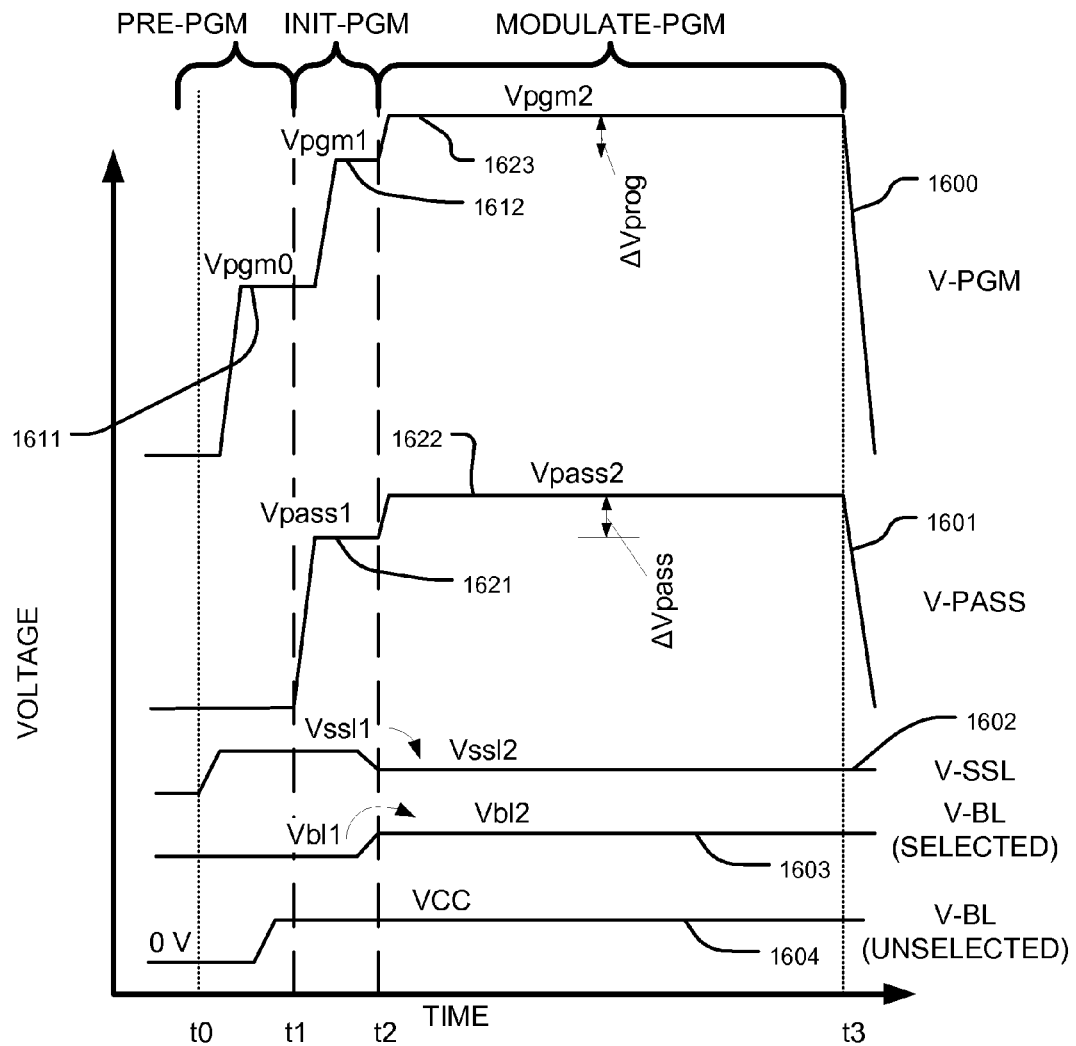
FIG. 16 is a graph of voltage versus time for a number of signals involved in applying a programming bias pulse to a flash memory cell, showing the program bias pulses applied as described herein, combining elements of the program bias pulses of FIGS. 7 and 14.

As this technique, as illustrated in FIG. 14, modifies the leading edge timing of a program bias pulse, it can be combined with a pulse like that shown in FIG. 5, where the program level for the program voltage 512 corresponds to the level during the initial portion of the modulated pulse. FIG. 16 illustrates one example of a program bias pulse including a combination of pre-program, initial program and modulated program stages, combining the effects of the program bias of FIG. 5 and the program bias of FIG. 14.

FIG. 16 illustrates a program bias pulse that combines the pre-programming stage PRE-PGM for suppressing local self-boosting, with the initial program stage INIT-PGM and modulating program stage MODULATE-PGM used for controlling the flow of the ISPP sequence. Before time t0, the voltages involved in the program bias pulse, including the bit line voltage 1604 on an unselected bit line V-BL (UNSELECTED), the bit line voltage 1603 on a selected bit line V-BL (SELECTED), the voltage 1602 on the SSL line V-SSL, the voltage 1601 on unselected word lines V-PASS, and the voltage 1600 on the selected word line V-PGM, are all about 0 V or ground. As time t0, the pre-programming stage starts, and V-SSL ramps to a level Vssl1 which can be about $V_{CC}$. Shortly thereafter, voltage V-PGM on the selected word line ramps to the intermediate level (1611) to a voltage Vpgm0, and then unselected bit line voltage V-BL (UNSELECTED), ramps to about $V_{CC}$. At time t1, the pre-programming stage is completed, the voltage V-PGM on the selected word line settles at the intermediate level Vpgm0, and the SSL switch on the unselected strings is turned off Beginning at time t1, the initial programming stage begins, where the voltage V-PASS on unselected word lines ramps to the initial pass voltage level 1621 at voltage Vpass1 and the voltage V-PGM on the selected word line ramps to the initial program voltage level 1612 at voltage Vpgm1. At time t2, the voltage V-SSL on the SSL switch line is reduced to the Vssl2 level, while the voltage V-BL (SELECTED) on the selected bit line is increased to the level Vbl2 to reduce or cut off current flow in the selected string. Also, the voltage V-PASS on unselected word lines ramps to the second pass voltage level 1622 at voltage Vpass2 and the voltage V-PGM on the selected word line ramps to the second program voltage level 1623 at voltage Vpgm2, causing boosting of the body of the selected string by an amount which is a function of ΔVpass and ΔVprog, as discussed in detail above. At time t3, the program bias pulse ends.

Thus, a method for producing a program bias pulse implemented using a controller on an integrated circuit as shown in FIG. 17, is described including:

biasing the bit lines and string select lines in a first condition (e.g. conditions of time t0 to t1);

setting a word line coupled to a target cell to a first voltage level (e.g. Vpgm0) while the bit lines and string select lines are in the first condition;

thereafter, biasing the bit lines and string select lines in a second condition (e.g. conditions of time t1 to t2);

setting the word line coupled to the target cell to a second voltage level (e.g. Vpgm1) higher than the first voltage level while the bit lines and string select lines are in the second condition;

thereafter, biasing the bit lines and string select lines in a third condition (e.g. t2 to t3); and setting the word line coupled to the target cell to a third voltage level (e.g. Vpgm2) higher than the second voltage level, while the bit lines and string select lines are in the third condition.

FIG. 17 is a simplified block diagram of an integrated circuit 975 including a NAND flash memory array 960 having modified ISPP programming logic as described herein. In some embodiments, the array 960 can include multiple levels of cells. A row decoder 961 is coupled to a plurality of word lines 962 arranged along rows in the memory array 960. Column decoders in block 966 are coupled to a set of page buffers 963, in this example via data bus 967. The global bit lines 964 are coupled to local bit lines (not shown) arranged along columns in the memory array 960. Addresses are supplied on bus 965 to column decoder (block 966) and row decoder (block 961). Data is supplied via the data-in line 973 from other circuitry 974 (including for example input/output ports) on the integrated circuit, such as a general purpose processor or special purpose application circuitry, or a combination of modules providing system-on-a-chip functionality supported by the array 960. Data is supplied via the line 973 to input/output ports or to other data destinations internal or external to the integrated circuit 975.

A controller 969, implemented for example as a state machine, provides signals to control the application of bias arrangement supply voltages generated or provided through the voltage supply or supplies in block 968 to carry out the various operations described herein. These operations include erase and read operations, and modified ISPP programming as described above. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The controller 969 can be configured to implement a method for programming, that includes applying a program bias arrangement like that of FIG. 7, including applying a program bias to the selected word line and pass biases to other word lines in the plurality of word lines, the program bias and pass biases having first magnitudes during an initial interval of the program step, and being shifted during a subsequent interval to respective second magnitudes;

applying a bit line bias to the sensing node corresponding to the selected string and a reference bias to the reference node corresponding to the selected string; and applying a string select bias to the at least one string select line, the bit line bias and string select bias being set to turn on the string select switch during the initial interval of the program step, and being shifted during the subsequent interval of the program step to turn off the string select switch.

The controller can also include logic which, during the initial interval, sets a bit line bias at a program bias level Vbl1, the string select bias is ramped to Vssl1, where (Vbl1−Vssl1) is greater than a threshold voltage for the string select switch, and then the program bias and pass bias are ramped to the respective first magnitudes, and during the subsequent interval the bit line bias is increased and the string select bias is decreased so that (Vbl1−Vssl1) is less than a threshold voltage for the string select switch, and then the program bias and pass bias are ramped to the respective second magnitudes.

The controller can also implement the pulse shapes shown in FIG. 14, to suppress disturbance on unselected bit lines. The controller can be implemented to apply the modified program bias pulse like that of FIG. 14, independent of the location of the target cell, or only when the target cell is near a switch transistor such as a GSL or SSL line. In addition, the controller can implement the pulse shapes like that of FIG. 16, combining the suppression of local self-boosting and the modulated ISPP sequence described herein.

The controller can include logic to implement a two-phase (or multi-phase) ISPP programming sequence, in which the program bias arrangement for Vpgm, ΔVpgm Vpass, ΔVpass, Vbl, Vssl, Vgsl and Vcs are set for a first ISPP slope during a first phase, and then the program bias arrangement is set using a modified program bias arrangement as described herein during a second phase, so that the ISPP slope is lower in the second phase than it is in the first phase, enabling tighter margins for programming flash memory.

Figure 18:
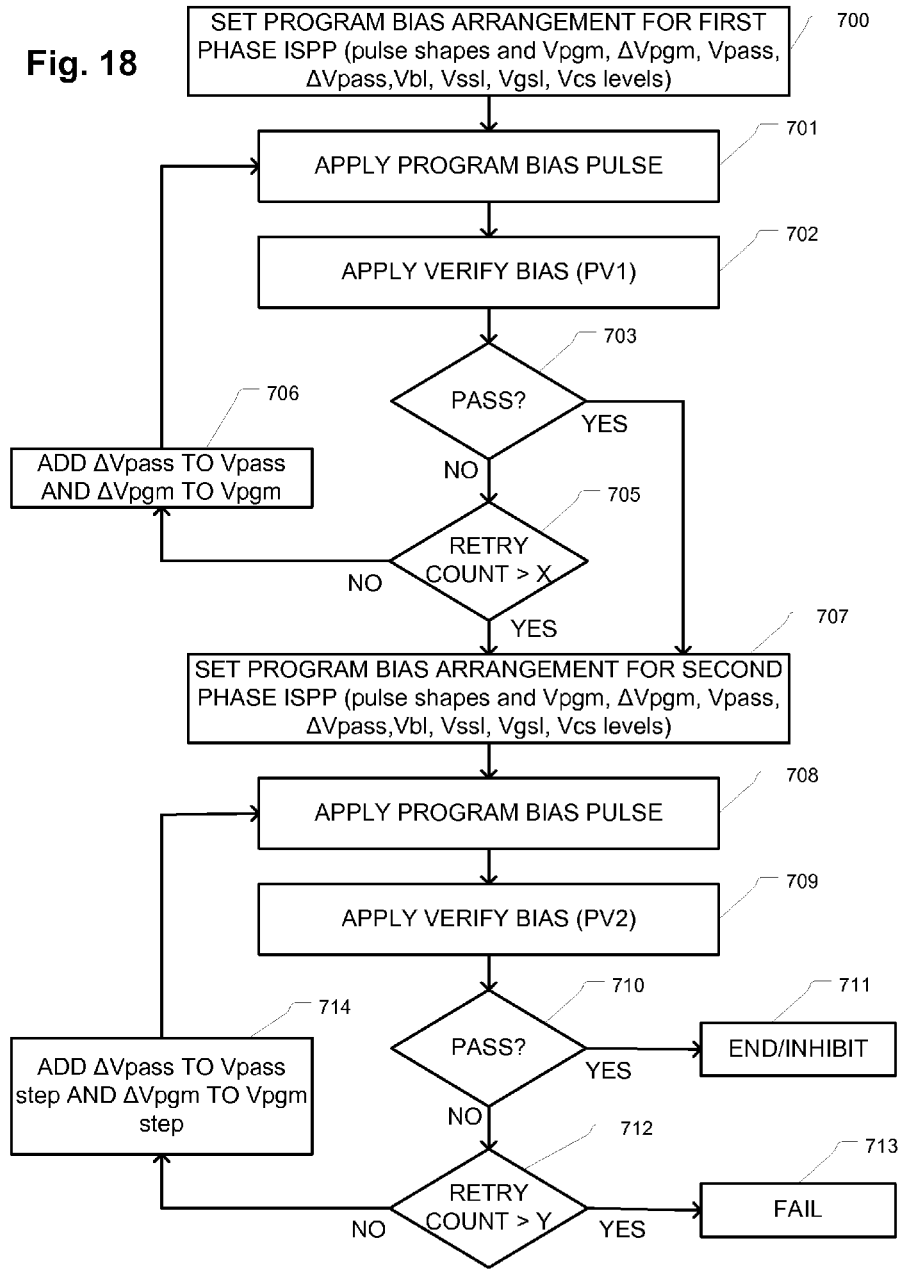
FIG. 18 is a simplified flowchart of an embodiment of logic executed by a controller in an integrated circuit like that of FIG. 17 implementing a two-phase or multi-phase modified ISPP programming sequence.

FIG. 18 is a flow chart illustrating logic executed by the controller in one example system, that implements a two-phase ISPP sequence such as that described with reference to FIG. 9B. In the beginning of a program operation, the controller, including the supporting circuitry on the chip, sets a program bias arrangement for the first phase ISPP sequence (700). The bias arrangement for the first phase includes the pulse shapes and voltage levels for the program voltage Vpgm, the pass voltage Vpass, the bit line voltage Vbl for selected and unselected strings, the string select line voltage Vssl, the ground select line voltage Vgsl, and the common source line voltage Vcs. For example, in one embodiment, the first phase involves a standard ISPP sequence, where the pulses are set as "square waves" such as shown in the first phase of the sequence of FIG. 9, or stepped waves as shown in FIG. 14 to suppress GIDL. Next, the program bias pulse is applied (701) followed by a verify bias using a preliminary verify voltage level VP1 (702). Next, the logic determines whether the target cell passed the verify operation at the preliminary verify voltage level VP1 (703). If it did pass, then the programming operation for that target cell proceeds to the second phase beginning at block 707. If the cell does not pass, then the logic determines whether a retry count exceeds a first phase retry count limit X (705). If the first phase retry count limit has not been exceeded, then the pass voltage and program voltage values are incremented by the parameters ΔVpass and ΔVpgm assigned for the first sequence (706). In various embodiments, ΔVpass and ΔVpgm can be constants, or vary from pulse to pulse during the sequence. Also, ΔVpass can be zero in some embodiments, for some or all of the pulses in the sequence.

If, at block 705, the first phase retry count limit has been exceeded, or at block 703 it is determined that the cell passed the preliminary verify level, then the logic sets the program bias arrangement for the second phase ISPP sequence (707). The bias arrangement for this phase includes the pulse shapes and voltage levels for stepped program voltages Vpgm, stepped pass voltages Vpass, the stepped bit line voltage Vbl for selected and unselected strings, the stepped string select line voltage Vssl, the ground select line voltage Vgsl, and the common source line voltage Vcs. For example, in one embodiment, the second phase involves a modified ISPP sequence, where the pulses are set as "stepped waves" such as shown in the second phase of the sequence of FIG. 9. Next, the program bias pulse is applied (708) followed by a verify bias (709). If the cell passes the preliminary program verify, the modified program pulse biases are used, like that described with reference to FIG. 7, so that smaller increments in threshold voltage can be induced such as the trace 131 in FIG. 8. Next, the logic determines whether the target cell passed the verify operation (710). If it did pass, then the programming operation for that target cell ends and the cell is biased for program inhibit during the balance of the program cycle (711). If the cell does not pass, then the logic determines whether a retry count exceeds a second phase retry count limit Y (712). If the second phase retry count limit is exceeded, then an error has occurred, and the process fails (713). If the second phase retry count limit has not been exceeded, then second portions of the stepped pass voltage and the stepped program voltage values are incremented by the parameters ΔVpass and ΔVpgm assigned for the second sequence (714). In various embodiments, ΔVpass and ΔVpgm can be constants, or vary from pulse to pulse during the sequence. Also, ΔVpass can be zero in some embodiments, for some or all of the pulses in the sequence. As mentioned above, for a modified ISPP bias using stepped pulses, ΔVpass and ΔVpgm can be equal, or can be set to different values in order to control the change in threshold voltage caused by the pulse, and thereby the ISPP slope. Also, for a program bias pulse arrangement for a modified ISPP bias using stepped pulses, the stepped Vpass can be applied to all or some of the unselected word lines in order to control the change in threshold voltage caused by the pulse, and thereby the ISPP slope.

If at block 705, the retry count X was exceeded and the cell did not pass the preliminary program verify in the first phase programming, in one alternative approach, the bit line voltage can be held constant during the second phase, at about ground during the program bias pulses with stepped program and pass voltages, until the cell passes the preliminary program verify. Typical ISPP pulse characteristic with slope=1 can still be achieved as illustrated on trace 130 in FIG. 8. Then, the program verify level can be increased to the target PV2, and Vbl stepping can be added to the pulses to finish the programming. This would result in a three phase programming cycle, in which the first phase of FIG. 9 is concatenated with the first phase of FIG. 9B, and the second phase of FIG. 9B.

Figure 19:
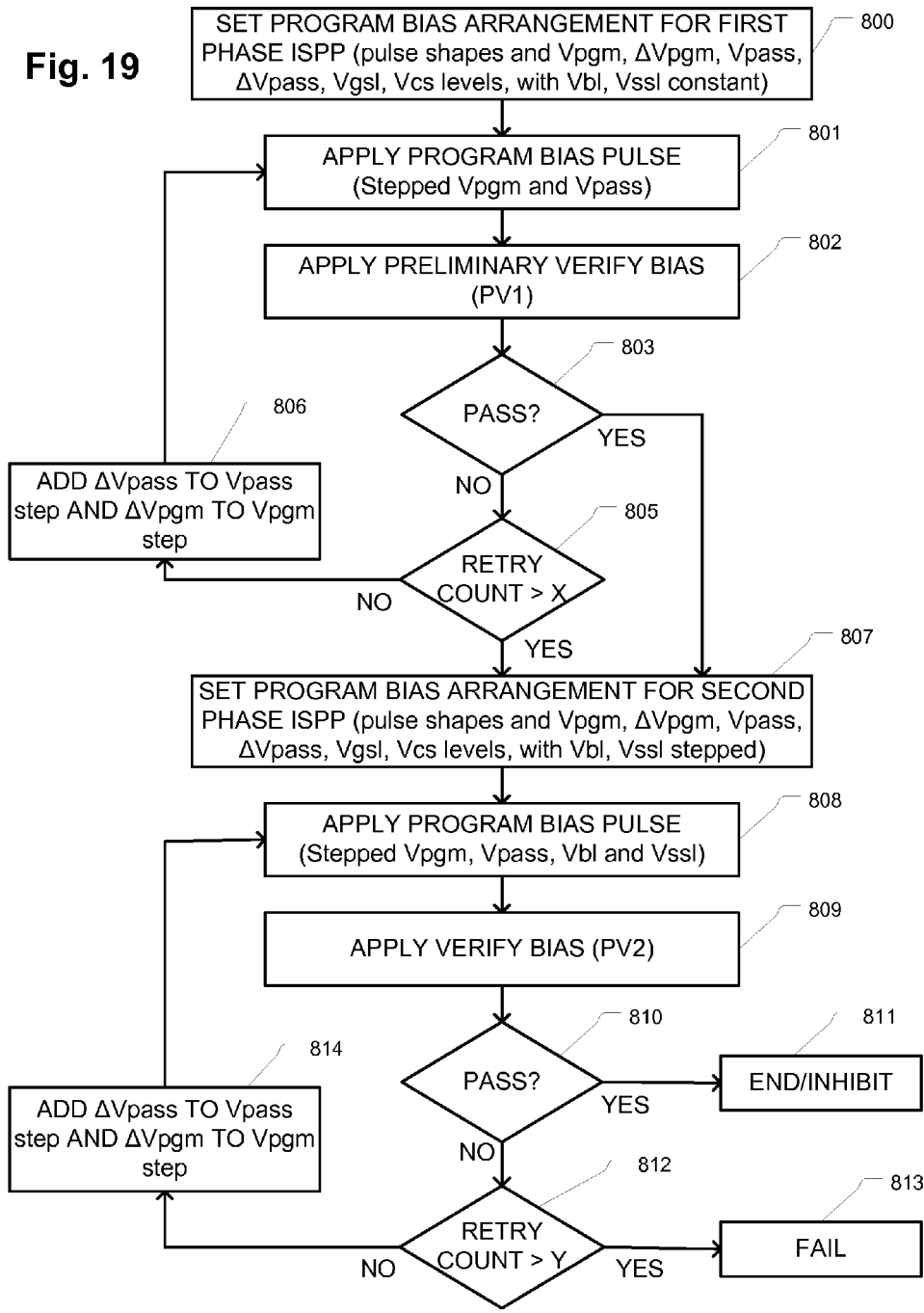
FIG. 19 is a simplified flowchart of an embodiment of logic executed by a controller in an integrated circuit like that of FIG. 17 implementing an alternative two-phase or multi-phase modified ISPP programming sequence.

FIG. 19 is a flow chart illustrating logic executed by the controller in one example system, that implements a two-phase ISPP sequence such as that described with reference to FIG. 9B. In the beginning of a program operation, the controller, including the supporting circuitry on the chip, sets a program bias arrangement for the first phase ISPP sequence (800). The bias arrangement for the first phase includes the pulse shapes and voltage levels for a stepped program voltage Vpgm, a stepped pass voltage Vpass, the bit line voltage Vbl for selected and unselected strings, the string select line voltage Vssl, the ground select line voltage Vgsl, and the common source line voltage Vcs. For example, in one embodiment, the first phase involves a sequence, where the program and pass voltage pulses are stepped such as shown in the first phase of the sequence of FIG. 9B. Also, the program and pass voltage pulses can include steps as shown in FIG. 14 to suppress GIDL. Next, the program bias pulse is applied (801) followed by a verify bias using a preliminary verify voltage level VP1 (802). Next, the logic determines whether the target cell passed the verify operation at the preliminary verify voltage level VP1 (803). If it did pass, then the programming operation for that target cell proceeds to the second phase beginning at block 807. If the cell does not pass, then the logic determines whether a retry count exceeds a first phase retry count limit X (805). If the first phase retry count limit has not been exceeded, then the second portions of the stepped pass voltage and program voltage values are incremented by the parameters ΔVpass and ΔVpgm assigned for the first sequence (806). In various embodiments, ΔVpass and ΔVpgm can be constants, or vary from pulse to pulse during the sequence. Also, ΔVpass can be zero in some embodiments, for some or all of the pulses in the sequence.

If, at block 805, the first phase retry count limit has been exceeded, or at block 803 it is determined that the cell passed the preliminary verify level, then the logic sets the program bias arrangement for the second phase ISPP sequence (807). The bias arrangement for this phase includes the pulse shapes and voltage levels for the program voltage Vpgm, the pass voltage Vpass, the bit line voltage Vbl for selected and unselected strings, the string select line voltage Vssl, the ground select line voltage Vgsl, and the common source line voltage Vcs. For example, in one embodiment, the second phase involves a modified ISPP sequence, where the pulses are set as "stepped waves" such as shown in the second phase of the sequence of FIG. 9B. In the second phase, the program bias pulse includes stepped Vssl and stepped Vbl on the selected bit lines. Thus, as shown in FIG. 9B, the Vssl level drops from Vssl1 to Vssl2 during the pulse, while the Vbl increases from Vbl1 to Vbl2 during the pulse. Vssl1 and Vbl1 are set to turn on the string select transistor, while Vbl2 and Vssl2 are set to be less than the threshold voltage for the string select transistor. Next, the program bias pulse is applied (808) followed by a verify bias (809). Next, the logic determines whether the target cell passed the verify operation (810). If it did pass, then the programming operation for that target cell ends and the cell is biased for program inhibit during the balance of the program cycle (811). If the cell does not pass, then the logic determines whether a retry count exceeds a second phase retry count limit Y (812). If the second phase retry count limit is exceeded, then an error has occurred, and the process fails (813). If the second phase retry count limit has not been exceeded, then the second portions of the stepped pass voltage and program voltage values are incremented by the parameters ΔVpass and ΔVpgm assigned for the second sequence (814). In various embodiments, ΔVpass and ΔVpgm can be constants, or vary from pulse to pulse during the sequence. Also, ΔVpass can be zero in some embodiments, for some or all of the pulses in the sequence. As mentioned above, for a modified ISPP bias using stepped pulses, ΔVpass and ΔVpgm can be equal, or can be set to different values in order to control the change in threshold voltage caused by the pulse, and thereby the ISPP slope. Also, for a program bias pulse arrangement for a modified ISPP bias using stepped pulses, the stepped Vpass can be applied to all or some of the unselected word lines in order to control the change in threshold voltage caused by the pulse, and thereby the ISPP slope.

In some embodiments, program bias pulses can be configured by the logic and circuitry associated with the controller to suppress local self-boosting and thereby inhibit the GIDL-induced hot carrier disturb, as described above in connection with FIG. 14. In such embodiments, the step of setting the program bias arrangement includes inducing a leading edge of the program bias pulse, so that the target word line is raised partly toward Vpgm, before the unselected bit lines are set to inhibit levels that turn off the SSL switch, and then boosted the remainder of the Vpgm level while the SSL switch is off. This leading edge modification of the program bias pulse to suppress local self-boosting, can be applied with the modified ISPP sequence, or can be applied with the standard ISPP sequence, or with both.

The programming method described here can be applied to conventional NAND arrays using common source architectures, and to other architectures in which the change in threshold voltage of a target cell during a program bias pulse can benefit from the more precise control achieved, or from the prevention of disturbance due to GIDL-induced leakage.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
a plurality of sensing nodes and reference nodes;
a plurality of strings of memory cells, each string in the plurality being arranged for connection between a corresponding sensing node and a corresponding reference node in the plurality of sensing nodes and reference nodes, and including a string select switch to selectively connect the string to the corresponding bit line;
a plurality of word lines and at least one string select line, word lines in the plurality coupled to corresponding memory cells in the plurality of strings and the at least one string select line coupled to corresponding string select switches in the plurality of strings; and
logic and circuitry coupled to the plurality of word lines, to the at least one string select line, and to a plurality of bit lines and reference nodes including a program node to program a memory cell in a selected string at a selected word line to establish a programmed cell threshold within a target threshold range, the logic and circuitry configured to apply a program bias pulse, including:
applying a program voltage to the selected word line and pass voltages to other word lines in the plurality of word lines, the program voltage and at least one of the pass voltages having first magnitudes during an initial interval of the program bias pulse, and being shifted during a subsequent interval to respective second magnitudes;
applying a bit line voltage to the sensing node corresponding to the selected string and a reference voltage to the reference node corresponding to the selected string; and
applying a string select voltage to the at least one string select line, the bit line voltage and string select voltage being set to turn on the string select switch during the initial interval of the program bias pulse, and being shifted during the subsequent interval of the program bias pulse to turn off, or to reduce conductivity of, the string select switch.

2. The memory of claim 1, wherein the logic and circuitry is configured to execute a verify step, including determining whether the selected memory cell has a programmed cell threshold within a target threshold range, and if the selected memory cell has failed verify fewer than a threshold number of times, then increasing the second magnitude of one or both of the program voltage and the pass voltages by a corresponding program voltage increment and corresponding pass voltage increments, and then retrying the applying a program bias pulse.

3. The memory of claim 2, wherein said increasing comprises increasing the second magnitude of the program bias by a program voltage increment, and increasing the second magnitude of the pass bias on at least one of the word lines by a pass voltage increment greater than the program voltage increment.

4. The memory of claim 1, wherein during the initial interval, the bit line voltage is set at a program bias level Vbl1, the string select voltage is ramped to Vssl1, where (Vssl1−Vbl1) is greater than a threshold voltage for the string select switch, and then the program voltage and pass voltages are ramped to the respective first magnitudes, and during the subsequent interval the bit line voltage is increased and the string select voltage is decreased so that (Vssl1−Vbl1) is less than a threshold voltage for the string select switch, and the program voltage and pass voltages are ramped to the respective second magnitudes.

5. The memory of claim 1, wherein the plurality of strings of memory cells are arranged as NAND strings.

6. A memory comprising:
a plurality of sensing nodes and reference nodes;
a plurality of strings of memory cells, each string in the plurality being arranged for connection between a corresponding sensing node and a corresponding reference node in the plurality of sensing nodes and reference nodes, and including a string select switch to selectively connect the string to the corresponding bit line;
a plurality of word lines and at least one string select line, word lines in the plurality coupled to corresponding memory cells in the plurality of strings and the at least one string select line coupled to corresponding string select switches in the plurality of strings; and
logic and circuitry coupled to the plurality of word lines, to the at least one string select line, and to a plurality of bit lines and reference nodes, for programming a memory cell in a selected string at a selected word line to establish a programmed cell threshold within a target threshold range, the program logic and circuitry configured to perform a program operation including at least a first phase and a second phase; and
during the first phase executing a program/verify sequence, the first phase including applying a first phase program bias pulse and a first phase verify step, the first phase program bias pulse including:
applying a program voltage having a magnitude to the selected word line and pass voltages to other word lines in the plurality of word lines;
applying a bit line voltage to the sensing node corresponding to the selected string and a reference voltage to the reference node corresponding to the selected string;
applying a string select voltage to the at least one string select line, the bit line voltage and string select voltage being set to turn on the string select switch; and
the first phase verify step including determining whether the selected memory cell has a programmed cell threshold within a preliminary target threshold range to identify whether the selected memory cell has passed or failed preliminary verify, and if the selected memory cell has passed preliminary verify, then entering the second phase, if the selected memory cell has failed verify fewer than a first retry limit, then increasing the magnitude of the program voltage and retrying applying a first phase program bias, and if the selected memory cell has failed preliminary verify the first retry limit, then entering the second phase; and
during the second phase executing a program/verify sequence including a program bias pulse and a second phase verify step, the second phase program bias pulse including:

applying a program voltage to the selected word line and pass voltages to other word lines in the plurality of word lines, the program voltage and at least one of the pass voltages having first magnitudes during an initial interval of the program bias pulse, and being shifted during a subsequent interval to respective second magnitudes;

applying a bit line voltage to the sensing node corresponding to the selected string and a reference voltage to the reference node corresponding to the selected string; and applying a string select voltage to the at least one string select line, the bit line voltage and string select voltage being set to turn on the string select switch during the initial interval of the program bias pulse, and being shifted during the subsequent interval of the program bias pulse to turn off, or to reduce conductivity of, the string select switch; and the second phase verify step including determining whether the selected memory cell has a programmed cell threshold within a target threshold range to identify whether the selected memory cell has passed or failed verify, and if the selected memory cell has passed verify, then ending the program operation, if the selected memory cell has failed verify fewer than a threshold number of times, then increasing the respective second magnitudes of the program and pass voltages and retrying applying a second phase program bias pulse.

7. The memory of claim 6, wherein said increasing comprises increasing the second magnitude of the program bias by a program voltage increment, and increasing the second magnitude of the pass bias on at least one of the word lines by a pass voltage increment greater than the program voltage increment.

8. The memory of claim 6 wherein, during the initial interval, the bit line voltage is set at a program bias level Vbl1, the string select voltage is ramped to Vssl1, where (Vssl1−Vbl1) is greater than a threshold voltage for the string select switch, and the program voltage and pass voltages are ramped to the respective first magnitudes, and during the subsequent interval the bit line voltage is increased and the string select voltage is decreased so that (Vssl1−Vbl1) is less than a threshold voltage for the string select switch, and the program voltage and pass voltages are ramped to the respective second magnitudes.

9. The memory of claim 6, wherein the plurality of strings of memory cells are arranged as NAND strings.

10. A memory comprising:
a plurality of sensing nodes and reference nodes;
a plurality of strings of memory cells, each string in the plurality being arranged for connection between a corresponding sensing node and a corresponding reference node in the plurality of sensing nodes and reference nodes, and including a string select switch to selectively connect the string to the corresponding bit line;
a plurality of word lines and at least one string select line, word lines in the plurality coupled to corresponding memory cells in the plurality of strings and the at least one string select line coupled to corresponding string select switches in the plurality of strings; and
logic and circuitry coupled to the plurality of word lines, to the at least one string select line, and to a plurality of bit lines and reference nodes; for programming a memory cell in a selected string at a selected word line to establish a programmed cell threshold within a target threshold range, the logic and circuitry configured to apply a program bias pulse for a selected memory cell, the program bias pulse including:
applying a program voltage having a program magnitude to the selected word line and pass voltages having a pass magnitude to other word lines in the plurality of word lines;
applying a bit line voltage to the sensing node corresponding to the selected string and a reference voltage to the reference node corresponding to the selected string;
applying an inhibit bit line voltage to the sensing node corresponding to an unselected string and a reference voltage to the reference node corresponding to the unselected string;
applying a string select voltage to the at least one string select line, the bit line voltage and string select voltage being set to turn on the string select switch on the selected string; and
wherein the program voltage ramps to a first magnitude less than the program magnitude, before the inhibit bit line voltage is applied to turn off the string select switches on the unselected strings, and then ramped to the program magnitude after the inhibit bit line voltage is applied to turn off the string select switches on the unselected strings.

11. The memory of claim 10, including:
in a first time interval ramping the program bias to a first magnitude, the first magnitude being lower than the program magnitude;
in a second time interval, after the first time interval, setting the gate voltage for the first string select switches to a magnitude more than a threshold higher than the bit line voltage on the selected string and less than a threshold lower than the inhibit bit line voltage on the unselected string; and
in a third time interval, after the second time interval, ramping the pass voltages to a pass voltage lower than the program magnitude and ramping the program voltage to the program magnitude.

12. The memory of claim 10, wherein the plurality of strings of memory cells are arranged as NAND strings.

13. A method for producing a program bias pulse for a charge storage memory device configured in a NAND array, including NAND strings coupled to bit lines via string select switches and including word lines, comprising:
biasing the bit lines and string select lines in a first condition;
setting a word line coupled to a target cell to a first voltage level while the bit lines and string select lines are in the first condition;
thereafter, biasing the bit lines and string select lines in a second condition; and
setting the word line coupled to the target cell to a second voltage level higher than the first voltage level while the bit lines and string select lines are in the second condition wherein:
the first condition includes setting a bit line voltage on a selected bit line and a voltage on a selected string select line for a selected string to couple the selected string to the bit line; and
the second condition includes setting the bit line voltage on the selected bit line and the voltage on the selected string select line to decouple the selected string from the bit line.

14. A method for producing a program bias pulse for a charge storage memory device configured in a NAND array, including NAND strings coupled to bit lines via string select switches and including word lines, comprising:
biasing the bit lines and string select lines in a first condition;
setting a word line coupled to a target cell to a first voltage level while the bit lines and string select lines are in the first condition;
thereafter, biasing the bit lines and string select lines in a second condition; and
setting the word line coupled to the target cell to a second voltage level higher than the first voltage level while the bit lines and string select lines are in the second condition, wherein:
the first condition includes setting a bit line voltage on a selected bit line and bit line voltages on unselected bit lines and a voltage on a selected string select line for a selected string to couple the selected string to the bit line and the unselected strings to unselected bit lines; and
the second condition includes setting the voltage on the selected string select line, setting the bit line voltage on the selected bit line to couple the selected string to the selected bit line, and setting bit line voltages on unselected bit lines to decouple the unselected strings from the unselected bit lines.

15. A method for producing a program bias pulse for a charge storage memory device configured in a NAND array, including NAND strings coupled to bit lines via string select switches and including word lines, comprising:
biasing the bit lines and string select lines in a first condition;
setting a word line coupled to a target cell to a first voltage level while the bit lines and string select lines are in the first condition;
thereafter, biasing the bit lines and string select lines in a second condition; and
setting the word line coupled to the target cell to a second voltage level higher than the first voltage level while the bit lines and string select lines are in the second condition, including after setting the word line coupled to the target cell to the second voltage level, biasing the bit lines and string select lines in a third condition, and setting the word line coupled to the target cell to a third voltage level higher than the second voltage level, while the bit lines and string select lines are in the third condition.

16. The method of claim 15, wherein:
the first condition includes setting a bit line voltage on a selected bit line and bit line voltages on unselected bit lines and a voltage on a selected string select line for a selected string to couple the selected string to the bit line and the unselected strings to unselected bit lines;
the second condition includes setting the voltage on the selected string select line, setting the bit line voltage on the selected bit line to couple the selected string to the selected bit line, and setting bit line voltages on unselected bit lines to decouple the unselected strings from the unselected bit lines; and
the third condition includes setting the bit line voltage on the selected bit line and the voltage on the selected string select line to decouple the selected string from the bit line.

17. An integrated circuit comprising:
a charge storage memory configured in a NAND array, including NAND strings coupled to bit lines via string select switches and including word lines; and
a controller configured to produce a program bias pulse by:
biasing the bit lines and string select lines in a first condition;
setting a word line coupled to a target cell to a first voltage level while the bit lines and string select lines are in the first condition; and
thereafter, biasing the bit lines and string select lines in a second condition within the program bias pulse to reduce or cut off current flow into the string via the string select switch, wherein:
the first condition includes setting a bit line voltage on a selected bit line and a voltage on a selected string select line for a selected string to couple the selected string to the bit line; and
the second condition includes setting the bit line voltage on the selected bit line and the voltage on the selected string select line to decouple the selected string from the bit line.

18. The integrated circuit of claim 17, wherein the controller configured to produce the program bias pulse sets the word line coupled to the target cell to a second voltage level higher than the first voltage level while the bit lines and string select lines are in the second condition.

19. An integrated circuit comprising:
a charge storage memory configured in a NAND array, including NAND strings coupled to bit lines via string select switches and including word lines; and
a controller configured to produce a program bias pulse by:
biasing the bit lines and string select lines in a first condition;
setting a word line coupled to a target cell to a first voltage level while the bit lines and string select lines are in the first condition; and
thereafter, biasing the bit lines and string select lines in a second condition within the program bias pulse to reduce or cut off current flow into the string via the string select switch, wherein:
the first condition includes setting a bit line voltage on a selected bit line and bit line voltages on unselected bit lines and a voltage on a selected string select line for a selected string to couple the selected string to the bit line and the unselected strings to unselected bit lines; and
the second condition includes setting the voltage on the selected string select line, setting the bit line voltage on the selected bit line to couple the selected string to the selected bit line, and setting bit line voltages on unselected bit lines decouple the unselected strings from the unselected bit lines.

20. An integrated circuit comprising:
a charge storage memory configured in a NAND array, including NAND strings coupled to bit lines via string select switches and including word lines; and
a controller configured to produce a program bias pulse by:
biasing the bit lines and string select lines in a first condition;
setting a word line coupled to a target cell to a first voltage level while the bit lines and string select lines are in the first condition; and
thereafter, biasing the bit lines and string select lines in a second condition within the program bias pulse to reduce or cut off current flow into the string via the string select switch; including, after setting the word line coupled to the target cell to the second voltage level, biasing the bit lines and string select lines in a third condition, and setting the word line coupled to the target cell to a third voltage level higher than the second voltage level, while the bit lines and string select lines are in the third condition.

21. The integrated circuit of claim 20, wherein:
the first condition includes setting a bit line voltage on a selected bit line and bit line voltages on unselected bit lines and a voltage on a selected string select line for a selected string to couple the selected string to the bit line and the unselected strings to unselected bit lines;
the second condition includes setting the voltage on the selected string select line, setting the bit line voltage on the selected bit line to couple the selected string to the selected bit line, and setting bit line voltages on unselected bit lines to decouple the unselected strings from the unselected bit lines; and
the third condition includes setting the bit line voltage on the selected bit line and the voltage on the selected string select line to decouple the selected string from the bit line.

* * * * *